(12) United States Patent
Nguyen et al.

(10) Patent No.: US 9,950,476 B2
(45) Date of Patent: Apr. 24, 2018

(54) DISTORTION PREDICTION AND MINIMISATION IN ADDITIVE MANUFACTURING

(71) Applicants: Commonwealth Scientific and Industrial Research Organisation, Campbell, Australian Capital Territory (AU); The Boeing Company, Seattle, WA (US)

(72) Inventors: Vu Thua Nguyen, Victoria (AU); Srinivasarao Lathabai, Victoria (AU); Yuqing Feng, Victoria (AU); Anthony Miller, South Australia (AU); John Barnes, Victoria (AU); Gary Coleman, Snohomish, WA (US); Amy Marie Helvey, Imperial, MO (US)

(73) Assignee: THE BOEING COMPANY, Chicago, IL (US)

( * ) Notice: Subject to any disclaimer, the term of this patent is extended or adjusted under 35 U.S.C. 154(b) by 364 days.

(21) Appl. No.: 14/731,919

(22) Filed: Jun. 5, 2015

(65) Prior Publication Data
US 2015/0352794 A1    Dec. 10, 2015

Related U.S. Application Data

(60) Provisional application No. 62/008,073, filed on Jun. 5, 2014.

(51) Int. Cl.
*B29C 67/00* (2017.01)
*G05B 19/4099* (2006.01)
(Continued)

(52) U.S. Cl.
CPC ........ *B29C 67/0088* (2013.01); *B22F 3/1055* (2013.01); *B29C 64/386* (2017.08);
(Continued)

(58) Field of Classification Search
CPC . B29C 67/0088; B33Y 50/02; G05B 19/4099; G06F 17/5018
See application file for complete search history.

(56) References Cited

U.S. PATENT DOCUMENTS 6,781,702 B2    8/2004    Giannakopoulos et al.
8,249,736 B2    8/2012    Kelley
(Continued)

FOREIGN PATENT DOCUMENTS

WO    2013/158805 A1    10/2013

OTHER PUBLICATIONS

Chiumenti et al. "Finite element modeling of multi-pass welding and shaped metal deposition processes" from "Computer Methods in Applied Mechanics and Engineering 199 (2010) 2343-2359".*
(Continued)

*Primary Examiner* — Yuhui R Pan
(74) *Attorney, Agent, or Firm* — MH2 Technology Law Group LLP

(57) ABSTRACT

A method of minimizing distortion in a workpiece is described that includes utilizing a computer system to carry out finite element analysis on a finite element thermo-mechanical model of the workpiece during and after fabrication by additive manufacturing to predict shape distortion and residual stress development in the workpiece, wherein the fabrication includes the fabrication step of depositing multiple layers of a material melted by a heat source along a deposit path on a substrate, and introducing alterations to the workpiece prior to or during fabrication to compensate for the predicted distortion.

25 Claims, 28 Drawing Sheets

(51) Int. Cl.
    G06F 17/50      (2006.01)
    B29C 64/386     (2017.01)
    B22F 3/105      (2006.01)
    B33Y 50/02      (2015.01)

(52) U.S. Cl.
    CPC .. *G06F 17/5018* (2013.01); *B22F 2003/1057* (2013.01); *B22F 2999/00* (2013.01); *B33Y 50/02* (2014.12)

(56) References Cited

U.S. PATENT DOCUMENTS

| | | | |
|---|---|---|---|
| 2006/0054039 A1* | 3/2006 | Kritchman | B33Y 40/00 101/424.1 |
| 2011/0130860 A1 | 6/2011 | Kelley | |
| 2011/0213594 A1 | 9/2011 | Zhang | |
| 2014/0107823 A1* | 4/2014 | Huang | 700/98 |
| 2014/0202999 A1* | 7/2014 | Wescott | B23K 26/0066 219/121.85 |

OTHER PUBLICATIONS

Klingbeil et al. "Residual stress-induced warping in direct metal solid freeform fabrication" from "International Journal of Mechanical Sciences 44 (2002) 57-77".*
Edwards et al. "Electron Beam Additive Manufacturing of Titanium Components: Properties and Performance" from "Journal of Manufacturing Science and Engineering • Dec. 2013".*
Körner et al. "Fundamental consolidation mechanisms during selective beam melting of powders" from "Modelling Simul. Mater. Sci. Eng. 21 (2013) 085011,".*
Notification of Transmittal of the International Search Report and the Written Opinion of the International Searching Authority, or Declaration dated Aug. 20, 2015 issued in PCT/AU2015/000341 (5 pages).
Written Opinion of the International Searching Authority dated Aug. 20, 2015 issued in PCT/AU2015/000341 (7 pages).
Supplementary European Search Report dated Jan. 16, 2018 in corresponding European Application No. 15802568.4, 13 pages.
Roberts, "Investigation of Residual Stresses in the Laser Melting of Metal Powders in Additive Layer Manufacturing," thesis, http://wlv.openrepository.com/wlv/bitstream/2436/254913/1/Roberts_PhDThesis.pdf, Sep. 1, 2012, 246 pages.

* cited by examiner

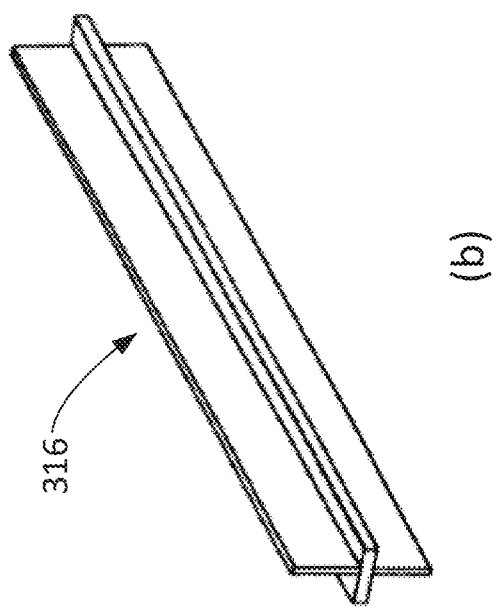
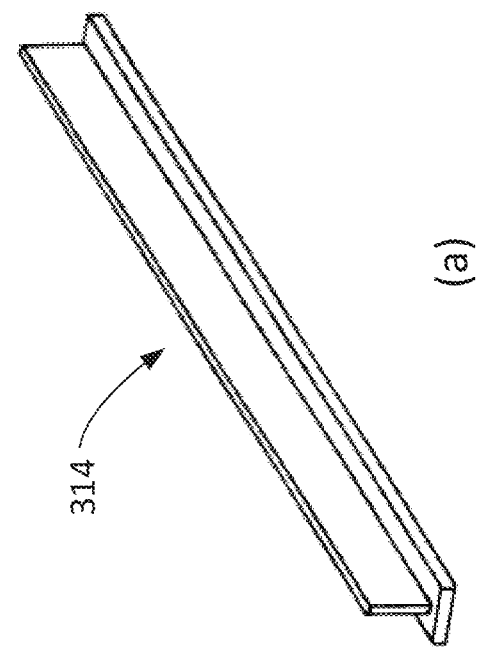
Figure 12

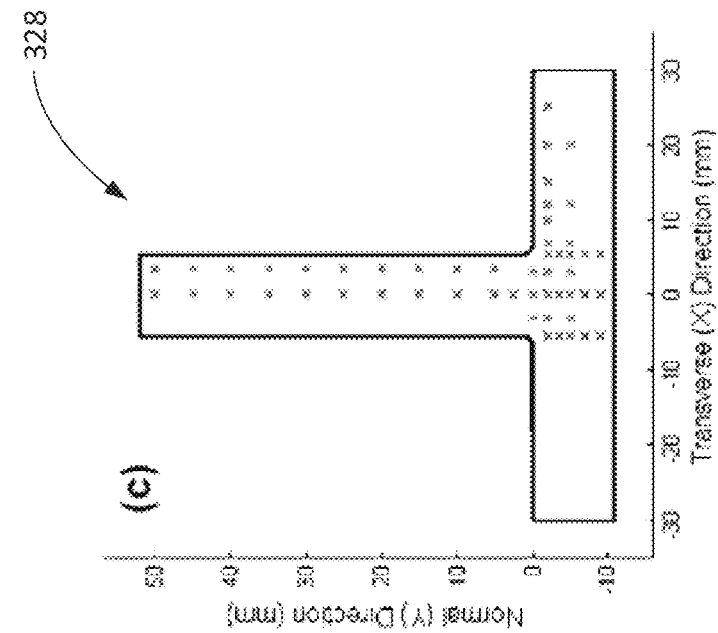
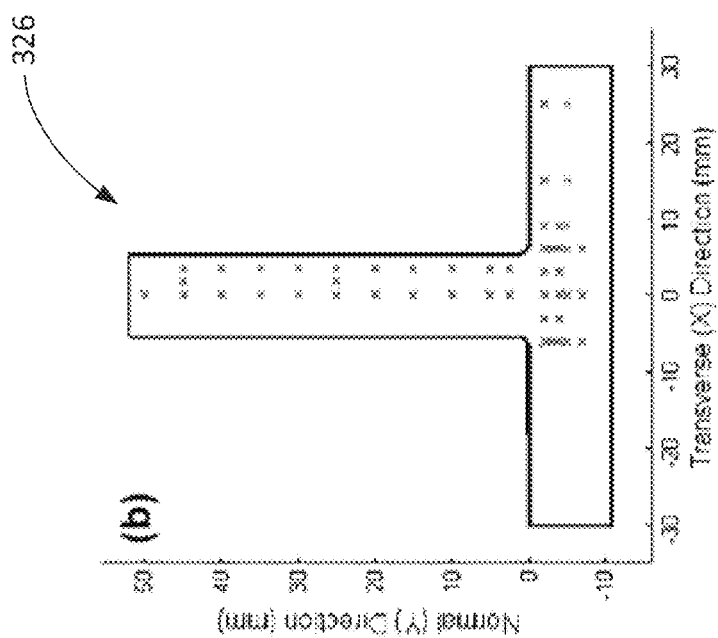
Figure 13

1. Model mesh
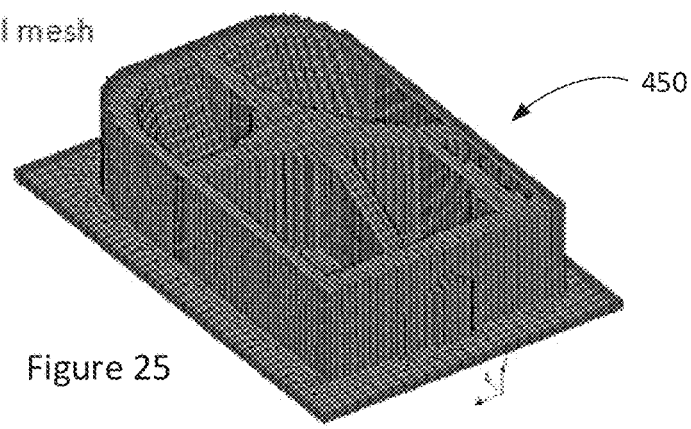
Figure 25
Figure 26
2. Base/reference case
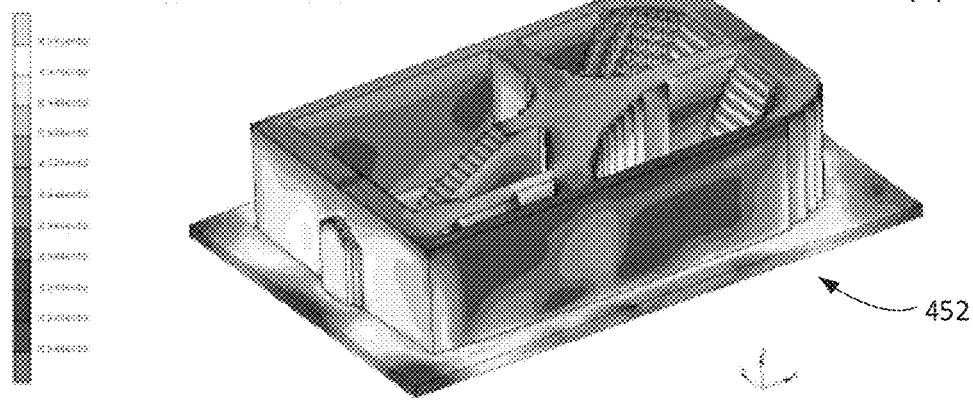
(a)
von Mises stress at end build
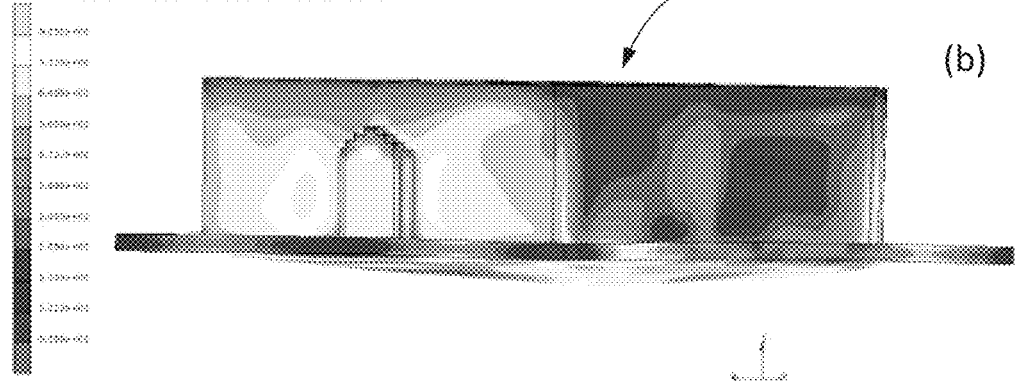
(b)

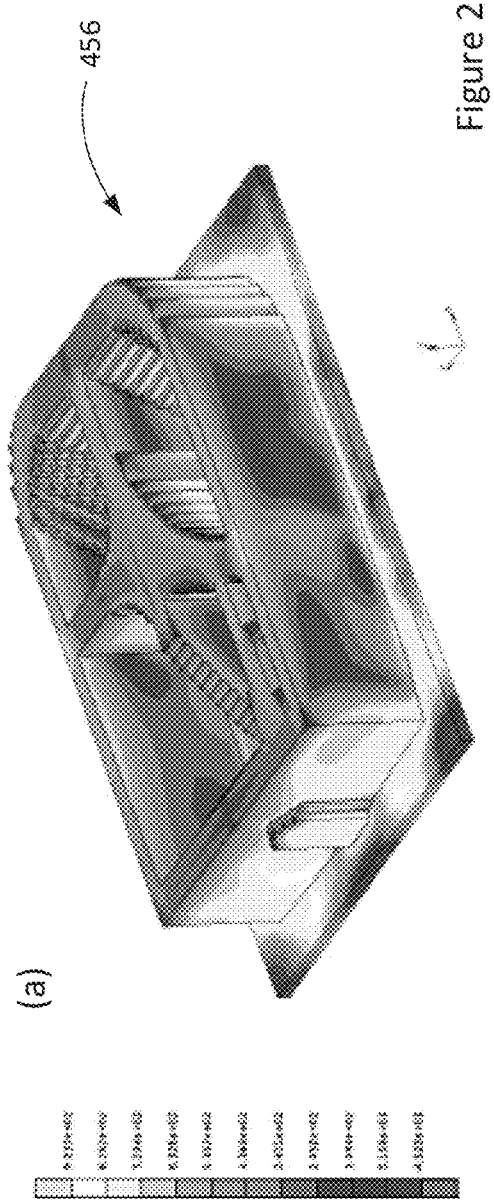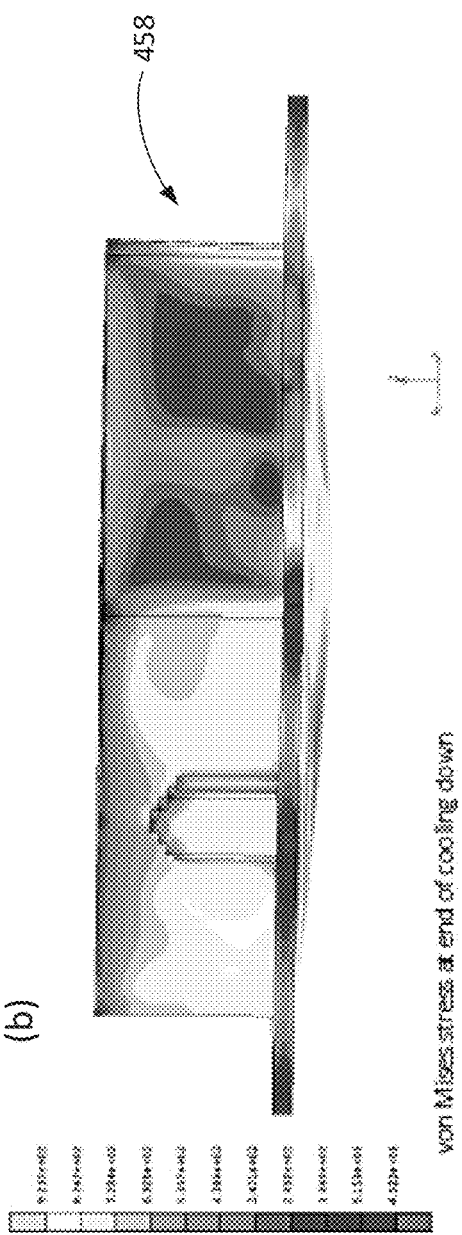
Figure 27

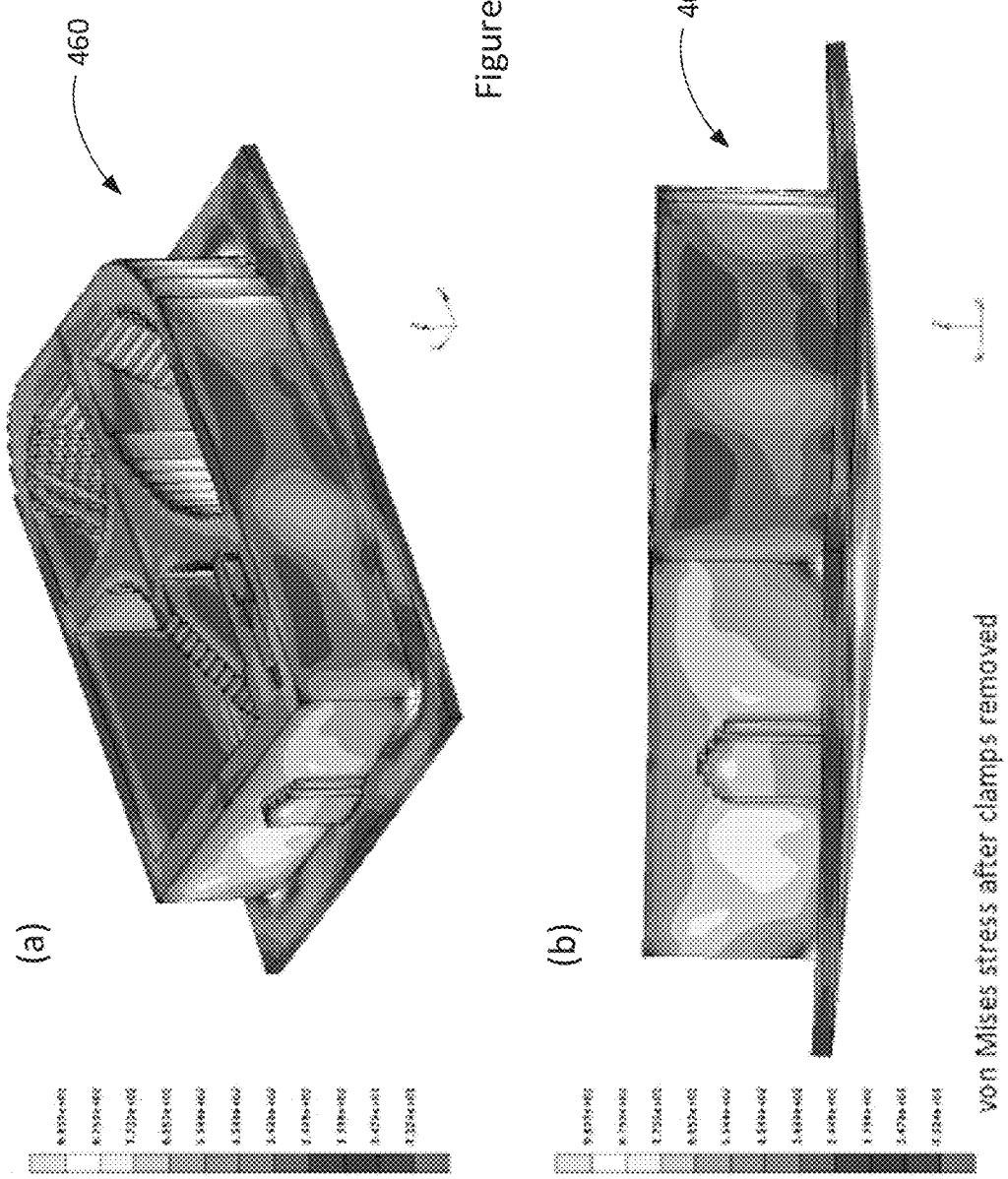

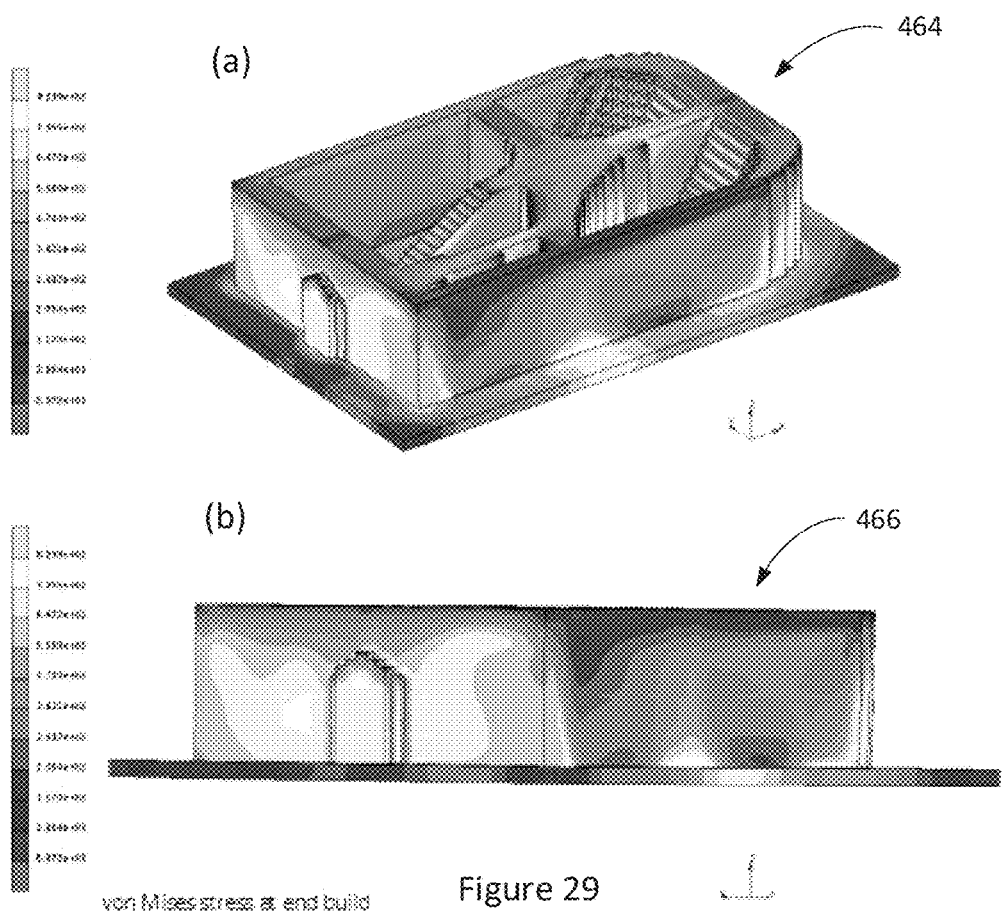
von Mises stress at end build   Figure 29
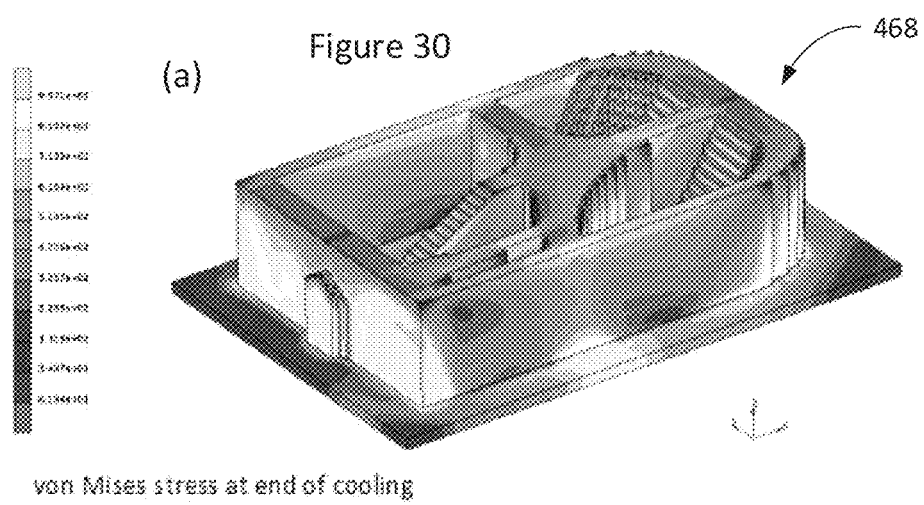
Figure 30
von Mises stress at end of cooling Distortion comparison:
(a) prediction for reference case
(b) experimental build of reference case
(c) 1st iteration of distortion-managed case

DISTORTION PREDICTION AND MINIMISATION IN ADDITIVE MANUFACTURING

This application claims priority to U.S. Provisional Application No. 62/008,073 filed Jun. 5, 2014, the entire content of which is hereby incorporated by reference.

FIELD

The present disclosure relates generally to additive manufacturing where successive layers of metallic material are laid down on a substrate, and in particular to the prediction and minimisation of distortion in additive manufacturing processes. It will be convenient to describe the prediction and minimisation of distortion in relation to the exemplary application of the manufacture of custom-made metal parts by Electron Beam Free Form Fabrication (EBFFF), however it should be appreciated that the description is not limited to this exemplary application only and has general applicability to other forms of additive manufacturing.

BACKGROUND

Additive manufacturing has become an important industrial process for the manufacture of custom-made metal parts. EBFFF, also referred to as Electron Beam Additive Manufacturing (EBAM), is a rapid metal deposition process that works efficiently with a variety of weldable alloys. Starting with a 3D model from a CAD program of the part to be built, the EBFFF process builds the part layer by layer on a substrate of metal by introducing metal wire feedstock into a molten pool that is created and sustained using a focused electron beam in a vacuum environment. Operation in a vacuum ensures a clean process environment and eliminates the need for a consumable shield gas.

The EBFFF process has been shown to be a leading candidate for generating large near-net-shaped preforms. It has been demonstrated that significant cost savings can be realised using this process when compared to conventional processes due to the reduction in raw material usage and minimised lead times.

Residual stress and shape distortion are inherent features of additive manufacturing, particularly at high deposition rates which require high heat input to the substrate and previously deposited layers, resulting in large thermal gradients. In most cases, fabricated parts are heat treated after deposition to help relieve stresses. As a result, the presence of high stress leading to premature failure during service is not as much of a concern as are stress and stress-induced distortion during and after deposition. Residual stress and distortion associated with the EBFFF process are currently addressed by frequent stress-relieving steps during the build. However, such steps are cumbersome, time consuming and add to the production cost of objects manufactured using the EBFFF process.

It would be desirable to minimise the stress-relieving steps required during additive manufacturing. It would also be desirable to provide a means of improving the efficiency of additive manufacturing processes, and in particular to better manage the distortion and residual stress associated with additive manufacturing. It would also be desirable to provide a tool for predicting distortion in an additive manufacturing process so that measures can be taken to compensate for that distortion.

SUMMARY

In one aspect a method of minimising distortion in a workpiece is provided, including the steps of:

in a computer system, carrying out Finite Element Analysis (FEA) on a finite element thermo-mechanical model of the workpiece during and after fabrication by additive manufacturing to predict shape distortion and residual stress development in the workpiece, wherein the fabrication includes the fabrication step of depositing multiple layers of a material melted by a heat source along a deposit path on a substrate; and introducing alterations to the workpiece prior to or during fabrication to compensate for the predicted distortion.

In one or more embodiments, the fabrication further includes one of more of the following fabrication steps: preheating of the substrate, cooling of the workpiece and subsequent release of mechanical constraints on the workpiece.

The heat source may include one or more of an electron beam, welding arc, plasma arc or laser beam.

In one or more embodiments the alterations are made to one or more of the substrate geometry and the deposit path.

In one of more embodiments, the model includes a heat conduction element for modelling heat conduction in one or more of the substrate, the deposited material and a work table supporting the substrate.

In one of more embodiments, the model includes a heat transfer element for modelling heat transfer from the workpiece to the exterior.

The heat transfer element may model heat transfer according to thermal radiation of the workpiece.

For example, the heat transfer element may model heat transfer according to $$q=\varepsilon\sigma(T^4-T_{amb}^4)$$

where q is the heat flux, T is the temperature and $T_{amb}$ is the ambient temperature, $\varepsilon$ is the surface emissivity and $\sigma$ is the Stefan-Boltzmann constant.

The heat transfer element may additionally model heat transfer according to thermal conduction of the workpiece.

For example, the heat transfer element may model heat transfer according to $$q=h(T-T_{amb})$$

where q is the heat flux, T is the temperature and $T_{amb}$ is the ambient temperature.

In one or more embodiments, the model may include an elastic deformation element using Hooke's law, Young's modulus, Poisson's ratio and the coefficient of thermal expansion of the material.

In one of more embodiments, the model includes a yielding behaviour element following the von Mises criterion.

In one of more embodiments, the model includes a yielding behaviour element following empirically deriving temperature dependant flow stress data.

In one of more embodiments, the model includes a material deposition element where deposition of the material is modelled at the liquidus temperature or slightly above the liquidus temperature with a small amount of superheat.

In one of more embodiments, the model includes a solidification element.

In one of more embodiments, the model includes a material deposition element where deposition of the material by application of an energy/heat source to melt the material is modelled.

In one of more embodiments, the method further includes the step of:

using stress analysis information from the finite element analysis to identify local stress raisers that require relief during one or more of the fabrication stages using the heat source.

In one of more embodiments, the method further includes the step of:

minimising heat loss from the substrate and the deposited material during one or more of the fabrication stages by not cooling the workpiece between deposition of successive layers of material.

For example, the average temperature of the workpiece may be prevented from falling by 10% between deposition of successive layers of material.

In one of more embodiments, the method further includes the step of:

minimising heat loss from the substrate and the deposited material during one or more of the fabrication stages by applying insulation to the workpiece during fabrication.

In one of more embodiments, the method further includes the step of:

minimising heat loss from the substrate and the deposited material during one or more of the fabrication stages by applying radiation reflection to the workpiece.

In one of more embodiments, the method further includes the step of:

minimising the thermal gradient between the workpiece and the substrate by preheating the substrate before deposition of the material.

In one of more embodiments, the method further includes the step of:

controlling mechanical boundary conditions during one or more of the fabrication stages by controlled reduction of clamping forces in line with varying critical stress as the part cools so as to minimise or avoid crack formation or other fabrication defects.

In one of more embodiments, the material is a metal or metal alloy.

In one of more embodiments, the metal alloy comprises any one or more of titanium, aluminium, nickel, vanadium, tantalum, copper, scandium, boron or magnesium.

For example, the metal alloy may be titanium alloy Ti-6Al-4V.

In another aspect a computer-implemented method of predicting distortion in a workpiece is provided, the method including the steps of:

in a computer system, carrying out finite element analysis on a finite element thermo-mechanical model of the workpiece during and after fabrication by additive manufacturing to predict shape distortion and residual stress development in the workpiece, wherein the fabrication includes the fabrication step of depositing multiple layers of a material melted by a heat source along a deposit path on a substrate.

In still another aspect a non-transitory computer-readable medium encoding a series of instructions to cause a processor to perform a computer-implemented method is provided as described here above.

In yet another aspect an additive manufacturing apparatus is provided, including a heat source, a wire feeder, a work table for supporting a substrate on which material deposition is made, a movement mechanism for providing relative movement of the heat source, wire feeder and work table, and an evacuated chamber enclosing the heat source, wire feeder, work table and movement mechanism; and a control device for controlling operation of the heat source, wire feeder, work table and movement mechanism and for performing a method as described hereabove.

In another aspect a system is provided for predicting distortion in a workpiece fabricated by additive manufacturing, wherein the fabrication includes deposition of material melted by a heat source along a deposit path on the substrate, the system comprising:

a main memory for storing computer readable code for a finite element analysis application module;

at least one processor coupled to the main memory, said at least one processor executing the computer readable code in the main memory to cause the application module to carry out finite element analysis on a finite element thermo-mechanical model of the workpiece prior to and during fabrication to predict shape distortion and/or residual stress development in the workpiece.

BRIEF DESCRIPTION OF THE DRAWINGS

The following description refers in more details to the various embodiments. To facilitate an understanding, references are made in the description to the accompanying drawings where certain embodiments are illustrated. It is to be understood that the preferred embodiments illustrated in the drawings are not to be construed as limiting.

In the drawings:

FIGS. 12(a) and (b) respectively show schematic illustrations of T-shaped and cross-shaped parts fabricated by the apparatus of FIG. 1;

FIG. 25 depicts a third example of a workpiece geometry meshed using brick elements forming part of the data input into a software module of the computer system of FIG. 3;

FIGS. 26 to 28 show "heat maps" depicting the predicted workpiece geometry of FIG. 25 during various stages of fabrication where no compensation is made for predicted distortion;

FIGS. 29 to 31 show "heat maps" depicting the predicted workpiece geometry of FIG. 25 during various stages of fabrication where compensation is made for predicted distortion.

DETAILED DESCRIPTION

Figure 1:
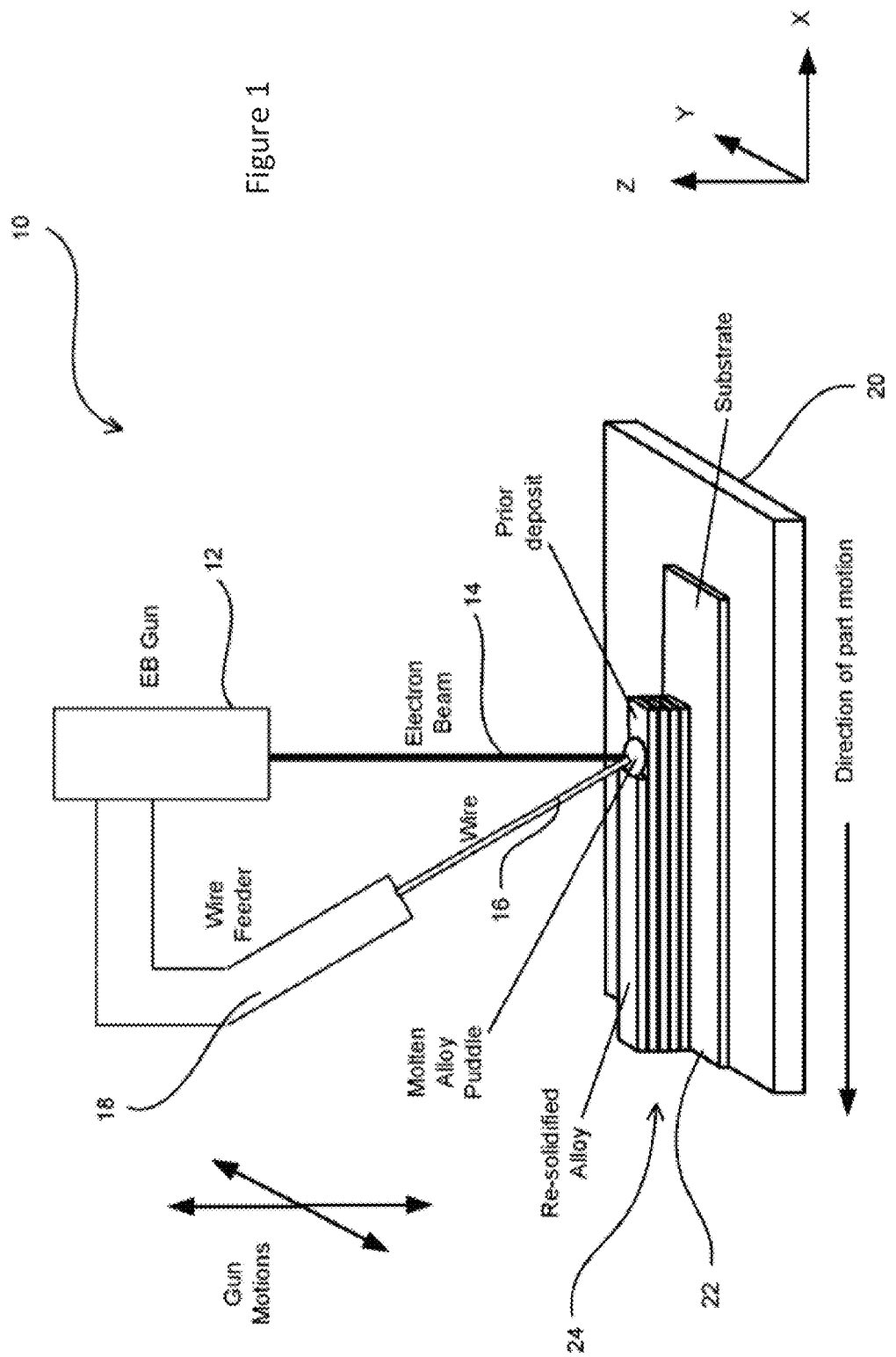
FIG. 1 is an isometric drawing showing a number elements of an electron beam direct manufacturing apparatus.

Referring now to FIG. 1, there is shown generally selected elements of an Electron Beam Free Form Fabrication (EBFFF) apparatus 10 for use in manufacturing workpieces by additive manufacturing. The apparatus 10 notably includes an electron beam gun 12 for generating an electron beam 14 that acts to melt metal wire feedstock 16 fed into a molten pool created and sustained by the electron beam from a wire feeder 18. The electron beam gun 12 and wire feeder 18 are maintained in a fixed disposition relative to each other but are moveable along the Y and Z axes. The apparatus 10 further includes a table 20 adapted to support a metallic substrate 22 upon which successive layers of metallic alloy 24 are deposited by operation of the electron beam gun 12 and wire feeder 18. The table 20 is displaceable along the X axis. In use, the electron beam gun 12/wire feeder 18 are displaced relative to the table 20 so as to lay down successive tracks of molten alloy, which resolidifies after deposition in order to form a desired layer of material.

Figure 2:
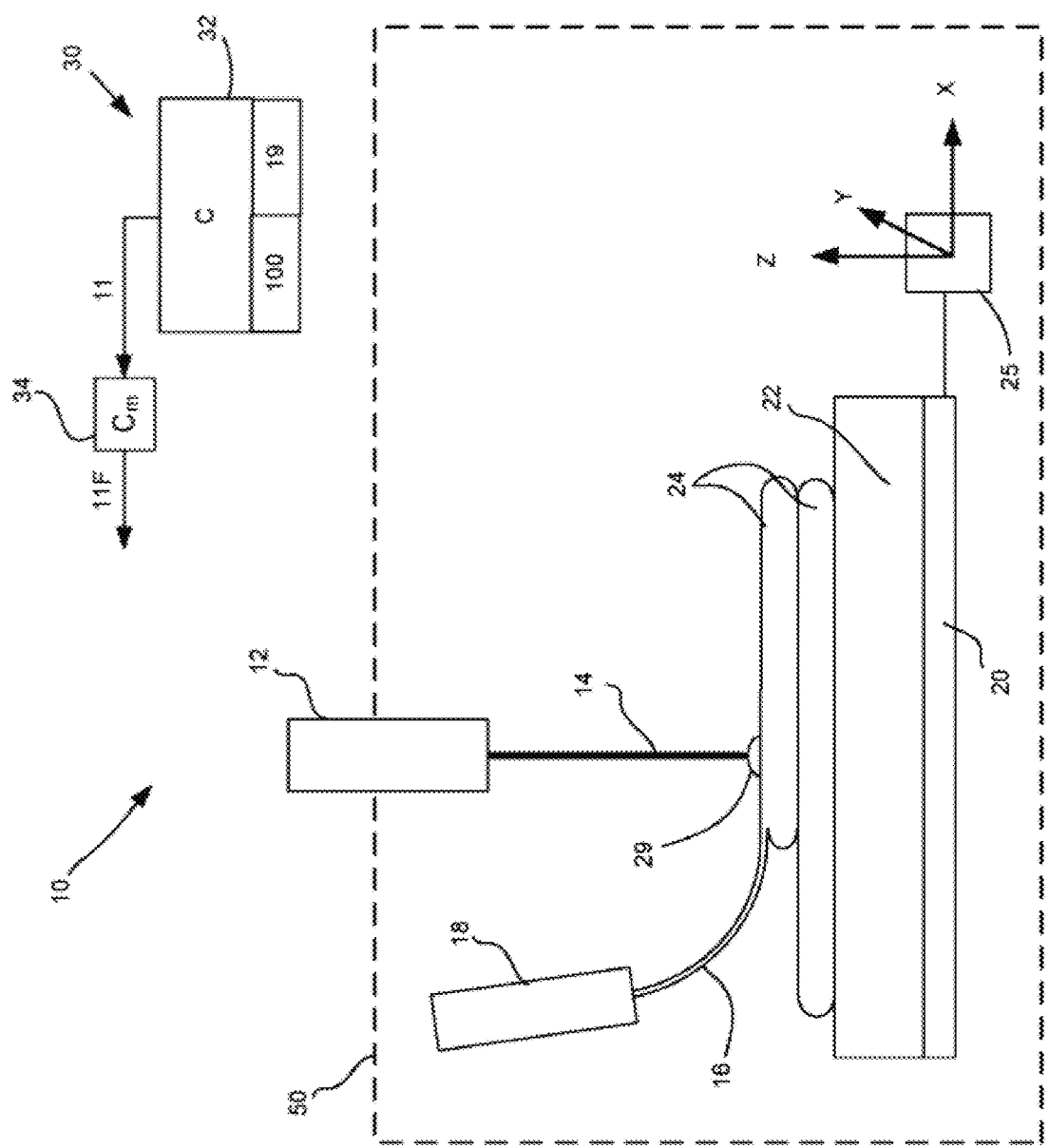
FIG. 2 is a schematic diagram of the servomechanisms and control systems used to drive and control the electron beam direct manufacturing apparatus depicted in FIG. 1.

FIG. 2 shows the electron beam gun 12 contained in a sealed container or vacuum chamber 50 capable of maintaining a vacuum environment. The electron beam gun 12 is adapted to generate and transmit the electron beam 14 within the vacuum environment, and to direct the electron beam 14 toward the substrate 22. In the arrangement depicted in FIG. 1, the substrate 22 is positioned on the table or moveable platform 20. Part of the gun 12 may be positioned outside of the chamber 50 for access and electrical connectivity. Alternately, the electron beam gun 12 may be completely enclosed within a chamber 50 so that the electron beam gun is also moved rather than just the substrate 22. In either case, the electron beam gun 12 moves relative to the substrate 22.

The platform 20 and/or the electron beam gun 12 may be movable via a multi-axis positioning drive system 25, which is shown schematically as a box in FIG. 1 for simplicity. A complex or three-dimensional (3D) object is formed by progressively forming and cooling a molten pool 29 into the layers 24 on the substrate 20. The molten pool 29 is formed by using the electron beam 14 to melt a consumable wire 16 formed from a suitable metal, such as aluminium or titanium. The wire 16 is fed toward the molten pool from a wire feeder 18, typically including a spool or other suitable delivery mechanism having a controllable speed.

The apparatus 10 shown in FIGS. 1 and 2 also includes a closed-loop controller (C) 30 having a host machine 32 and an algorithm(s) 100 adapted for controlling an EBFFF process conducted using the apparatus 10. The controller 30 is electrically connected to or in communication with a main process controller 34 which is adapted for sending necessary commands to the electron beam gun 12, the wire feeder 18, and any required motors (not shown) that position the substrate 22 and the gun 12, including a set of final control parameters 11F. The controller 30 generates and transmits a set of input parameters 11 that modifies the final control parameters 11F as set forth below.

The wire 16, when melted by the electron beam 14, in one embodiment to over approximately 1600 degrees C., is accurately and progressively deposited in successive layers according to a set of design data 19, such as Computer Aided Design (CAD) data or other 3D design file. In this manner, a 3D structural part or other complex object may be created by additive manner without the need for a casting die or mold.

Figure 3:
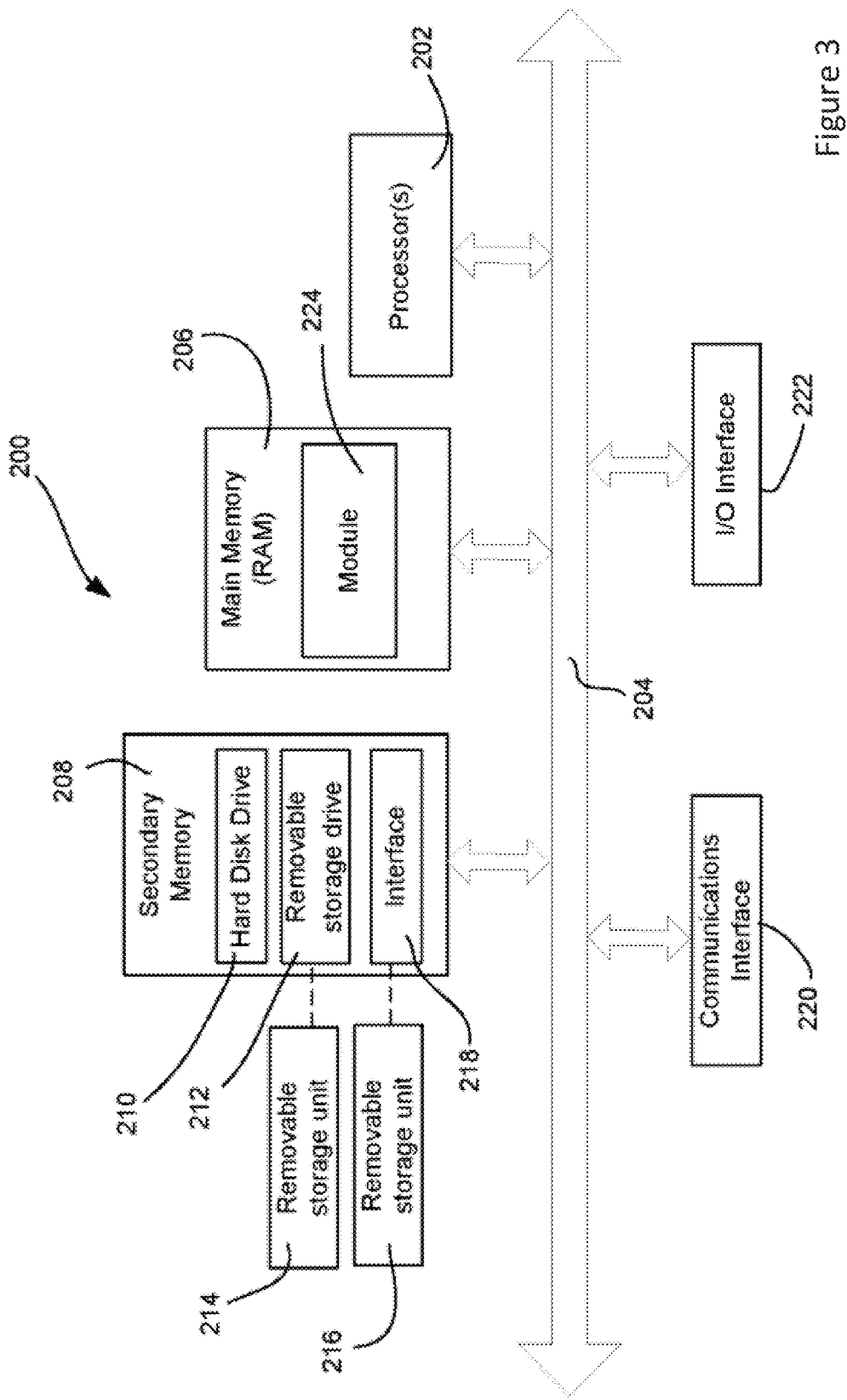
FIG. 3 is a functional diagram showing selected components of an exemplary computer system to predict distortion in a workpiece fabricated by the apparatus shown in FIG. 1 and optionally to provide data to the control systems depicted in FIG. 2 in order to minimise distortion in a workpiece fabricated by the apparatus shown in FIG. 1.

FIG. 3 depicts an exemplary computer system 200 for use in one or more embodiments, and notably for use in predicting the distortion likely to occur in a workpiece manufactured by the apparatus 10 and for providing data to the controller 30 in various embodiments to enable alterations to be introduced into the workpiece to compensate for that predicted distortion. The computer system includes one or more processors, such as processor 202, the processor 202 is connected to a computer system internal communications bus 204.

The computer system 200 also includes a main memory 206, preferably a Random Access Memory, and may also include a secondary memory 208. The secondary memory 208 may include, for example, one or more hard disk drives 210 and/or one or more removable storage drives 212. The removable storage drive 212 reads from and/or writes to a removal storage unit 214 in a well-known manner. As will be appreciated, the removable storage unit 214 includes a computer usable storage medium having stored therein computer software and/or data.

In alternative embodiments, the secondary memory 208 may include other similar means for allowing computer programs or other instructions to be loaded into the computer system 200. Such means may include, for example, a removal storage unit 216 and an interface 218. Examples of this may include a removable memory chip, such as an EPROM, USB flash memory or the like, and associated socket, or other removable storage units and interfaces which allow software and data to be transferred from the removable storage unit 216 to the computer system 200. The computer system 200 also includes a communications interface 220 connecting to the bus 204. The communications interface may also include an I/O interface 222 which provides the computer system 200 with access to a monitor, keyboard, mouse, printer, scanner, plotter and the like.

Computer programs in the form of a series of instructions to cause various functionality to be performed are stored in application module 224 in the main memory 206 and/or secondary memory 208. Computer programs may also be received via the communications interface 220. Such computer programs, when executed, enable the computer system 200 to perform features and provide functionality as described herein. In particular, the computer programs, when executed, enable the processor 202 to perform features as described herein.

In one embodiment, the application module 224 is configured to carry out finite element analysis on a finite element thermo-mechanical model of a workpiece prior to and during fabrication by additive manufacturing to predict shape distortion and/or residual stress development in the workpiece. In one or more embodiments, the application module 224 is also adapted to determine alterations to be made to the workpiece prior to or during fabrication to compensate for the predicted distortion. In addition, the module 224 stores the finite element thermo-mechanical model of the workpiece to be fabricated.

Figure 4:
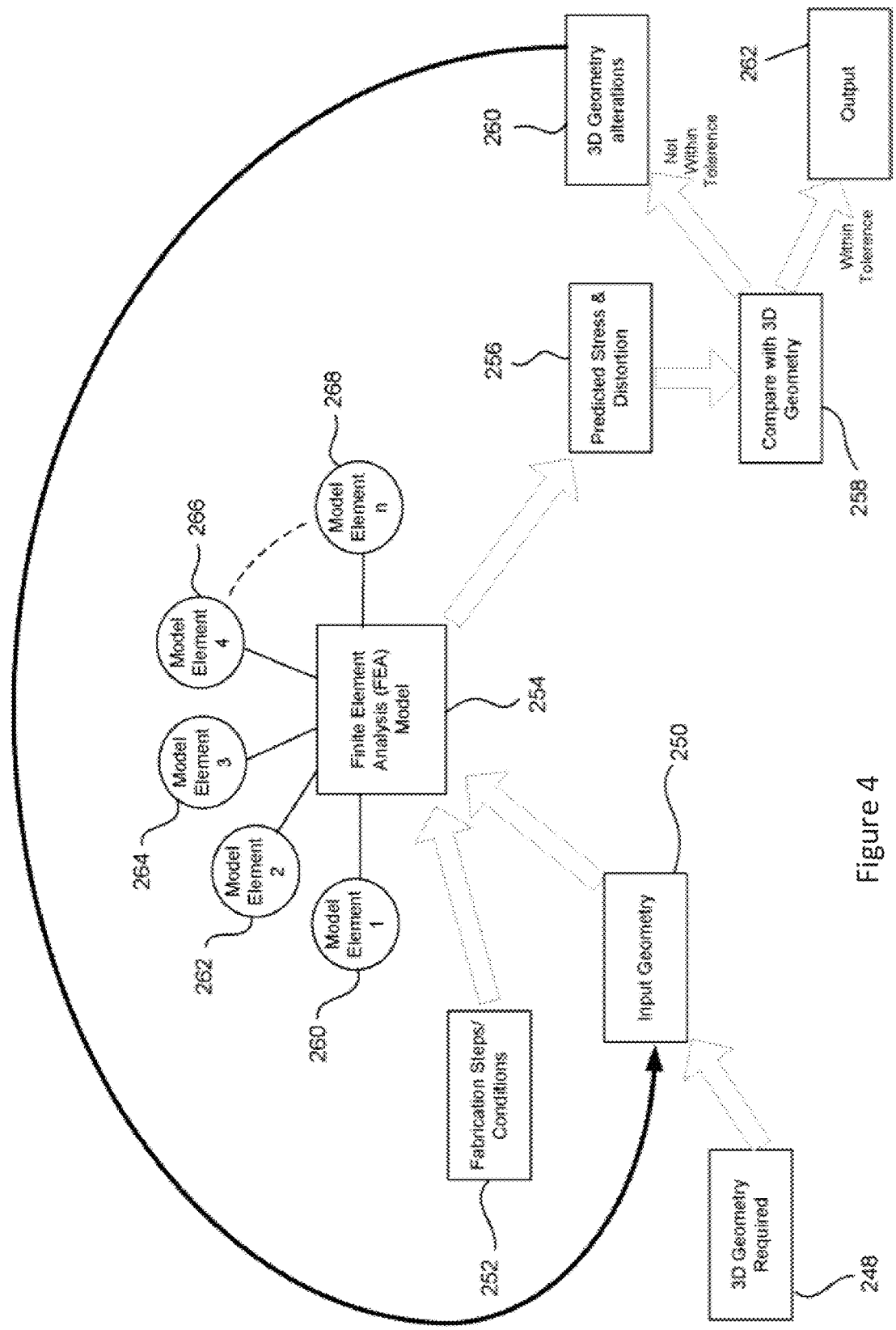
FIG. 4 is a schematic diagram showing data input into a software module of the computer system of FIG. 3, a Finite Element Analysis (FEA) model applied to that data by the software module as well as the predicted stress and distortion data and workpiece alteration data generated by the software module.

FIG. 4 is a schematic representation of data input into the module 224 of the computer system 200, the Finite Element Analysis (FEA) model applied to that data by the module 224 as well as the predicted stress and distortion data and workpiece alteration data generated by the module 224. The prediction of shape distortion and/or residual stress development in a workpiece fabricated by the equipment 10 is dependent upon the input of the 3D geometry 248 of the workpiece prior to, during and at the conclusion of the additive manufacturing process. In addition to the geometry input 250, parameters defining the various fabrication steps and conditions 252 are provided to the module 224.

An FEA model 254 is then used to carry out finite element analysis and determine the predicted stress and distortion 256 likely to arise in the workpiece during the fabrication process. The FEA model 254 includes a series of elements, here referenced 260 to 268, to enable the FEA model 254 to take into account relevant phenomena occurring on workpiece. The model elements 260 to 268 enable transient thermo-mechanical analyses to simulate the complete build of the workpiece to be carried out during all standard stages of a physical build. In one or more embodiments, these standard stages include preheating of the substrate, deposition of the material melted by an electron beam or other heat/energy source, the cooling of the workpiece after the build, and its subsequent deformation after mechanical restraints have been released.

The predicted distortion 256 is compared with the input geometry. If that comparison 258 indicates that predicted distortion is within a predetermined tolerance, then the input geometry 250 is output 262 to the controller 30. However, if the predicted distortion is greater than a predetermined tolerance then alterations 260 to are used to update the input geometry 250 to ensure that the fabricated workpiece includes compensation for the predicted distortion.

Figure 5:
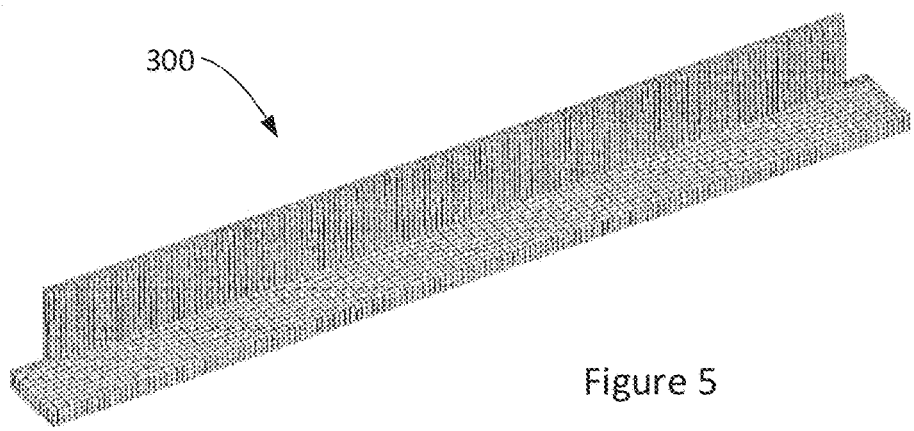
FIGS. 5 and 6 depict two examples of a workpiece geometry meshed using brick elements forming part of the data input into a software module of the computer system of FIG. 3.
Figure 6:
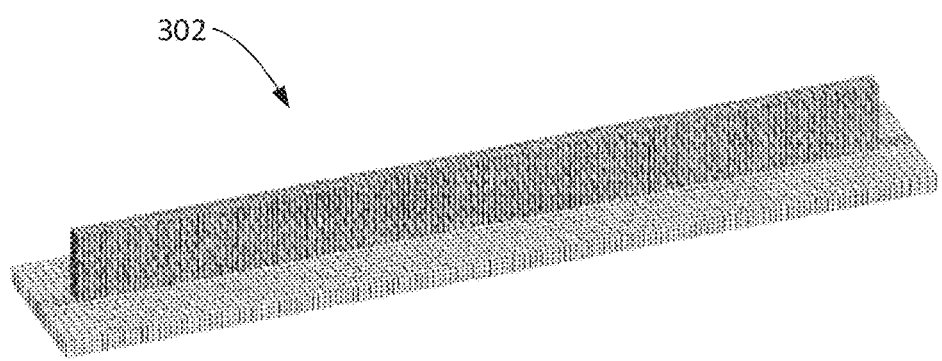

The geometry of the workpiece before, during and after fabrication is meshed using multi-node brick elements. FIGS. 5 and 6 depict examples 300 and 302 of T-shaped geometies meshed using linear 8-node brick elements. Typically, each workpiece may have around 10,000 to 30,000 elements, although the number of elements may be as high as is needed. In the case where there is bilateral symmetry of the workpiece and the build process, only half of the workpiece needs to be modelled (FIG. 5). However, where this is not the case then the entire geometry of the workpiece is modelled (FIG. 6). Prior to the build of the workpiece and during a substrate preheating phase, only the elements of the 3D geometry making up the substrate are active. As the workpiece build proceeds, the elements in the wall are progressively activated corresponding to the material being deposited. At any time, elements which are not yet active play no part on the model computations performed by the module 224 using the FEA model 254.

In one embodiment of the invention, the FEA model 254 includes the following model elements:

Heat Conduction Element

Figure 7:
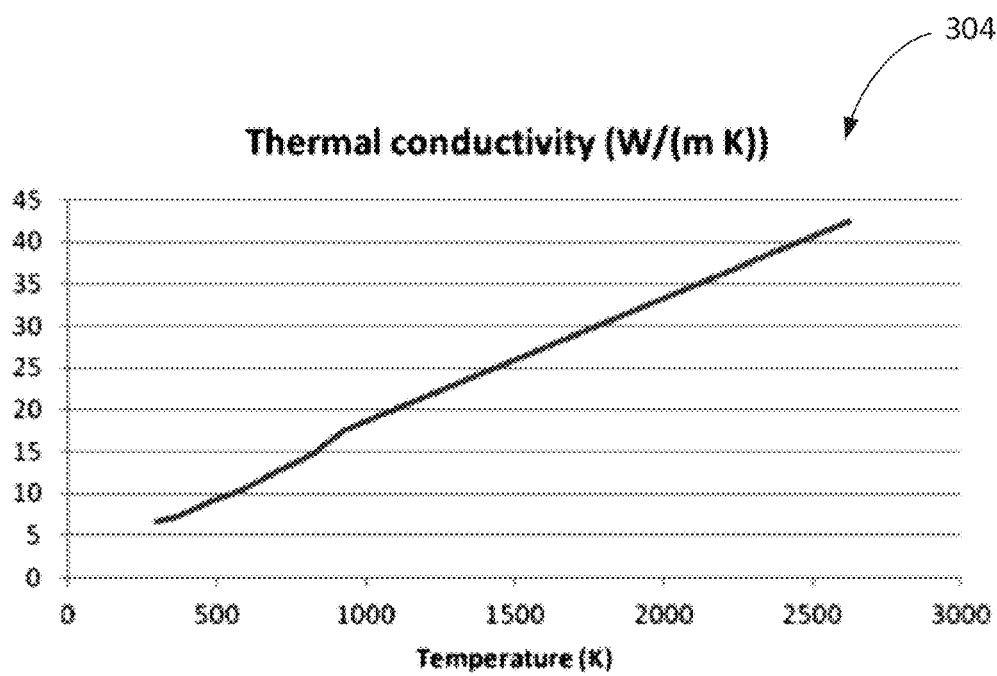
FIGS. 7 and 8 are temperature dependant plots of the thermal conductivity and specific heat capacity of the substrate and deposited material of the workpiece shown in FIGS. 5 and 6, the plots being included in a heat conduction element of the Finite Element Analysis (FEA) model forming part of the software module of the computer system of FIG. 3.
Figure 8:
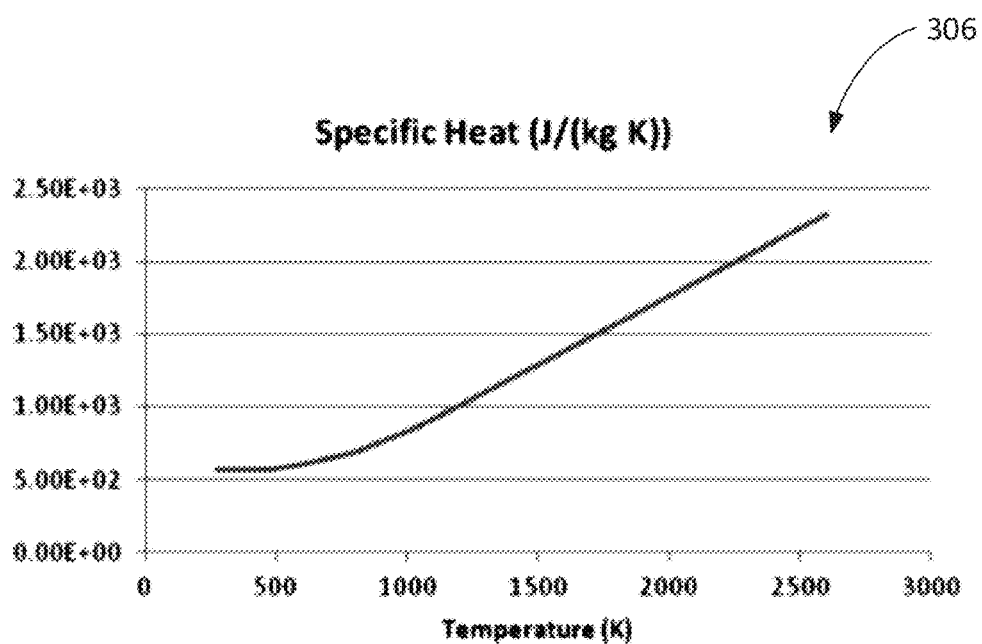

A heat conduction element for modelling heat conduction in the substrate and the deposited material. The thermal conductivity and specific heat capacity of the substrate and deposited material are temperature dependant. Exemplary plots 304 and 306 of the temperature dependence of these two properties are respectively depicted in FIGS. 7 and 8. Data for these plots can be compiled from a number of publicly available sources. In the case of a workpiece fabricated using a titanium alloy, one such suitable reference is: "Materials Properties Handbook: Titanium and Titanium Alloys", Editors R. Boyer, G. Welsch and E. W. Collings, ASM International, Materials Park, Ohio, USA, 1994.

Heat Transfer Element

A heat transfer element for modelling heat transfer from the workpiece to the exterior. In one embodiment the heat transfer element models heat transfer according to thermal radiation of the workpiece. Optionally, the heat transfer element may additionally model heat transfer according to thermal conduction of the workpiece.

The thermal radiation of the workpiece can be modelled using the following radiation condition:

$$q = \varepsilon \sigma (T^4 - T_{amb}^4)$$

where q is the heat flux, ε is the surface emissivity and a is the Stefan-Boltzmann constant. Note that in this latter expression the temperature is the absolute temperature (K). The vales of h and ε can be adjusted to match experimental results. In the case of workpieces fabricated from titanium alloys, typical values for these parameters have been found to be h≈20 W/(m²K) and ε≈0.7. The value of $T_{amb}$=303.15 K (30° C.) can usually be used, though this was also sometimes adjusted to better match experimental results.

The thermal conduction can be modelled according to:

$$q = h(T - T_{amb})$$

where q is the heat flux, T is the temperature and $T_{amb}$ is the ambient temperature; or by using a radiation condition.

Elastic Deformation Element

Figure 9:
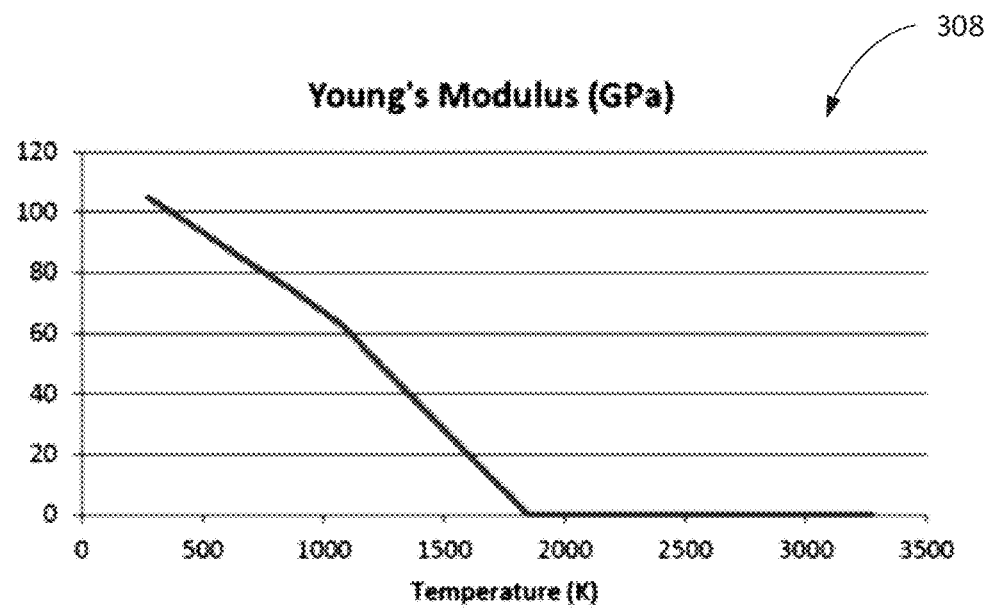
FIGS. 9 and 10 are temperature dependant plots of Young's modulus and the coefficient of thermal expansion of the substrate and deposited material of the workpiece shown in FIGS. 5 and 6, the plots being included in an elastic deformation element of the Finite Element Analysis (FEA) model forming part of the software module of the computer system of FIG. 3.
Figure 10:
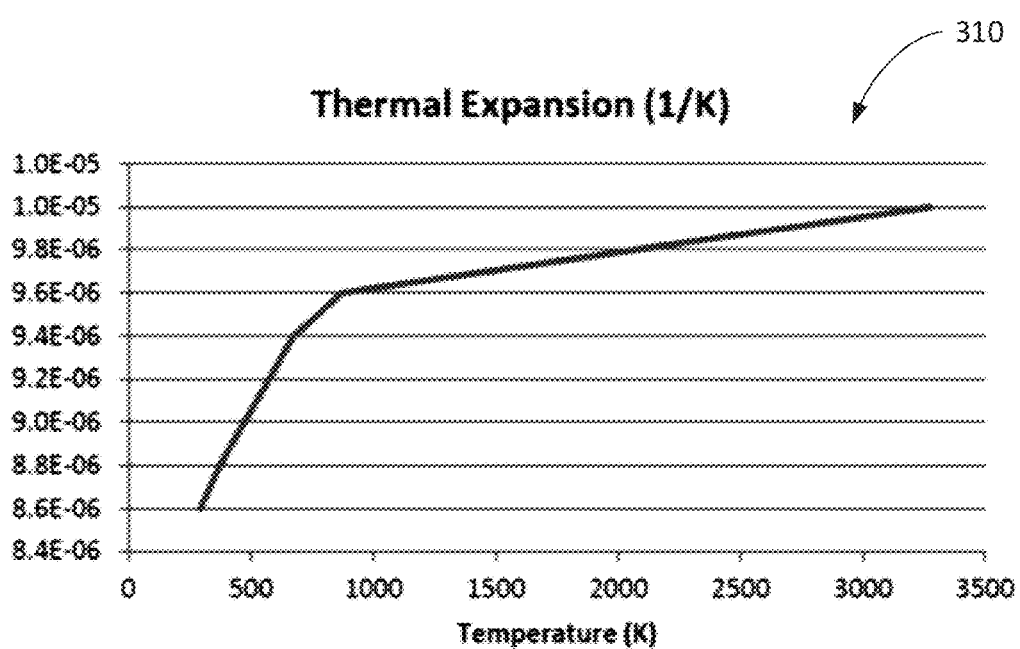

The material properties including in this model element are Young's modulus, Poisson's ratio and the coefficient of thermal expansion. Isotropic properties have been assumed. In one or more embodiments, Poisson's ratio is taken to be v=0.3. Both Young's modulus and the coefficient of thermal expansion are temperature dependent, and values are available from publicly available literature, such as the above mentioned handbook. Exemplary plots 308 and 310 of these properties against temperature are respectively depicted in FIGS. 9 and 10. Whilst data for Young's modulus was available for temperatures up to around 1073 K (800° C.), the available data was extrapolated for higher temperatures and it was assumed that Young's modulus is zero (0) when the workpiece material reaches liquidus temperature.

Yielding Behaviour Element

Figure 11:
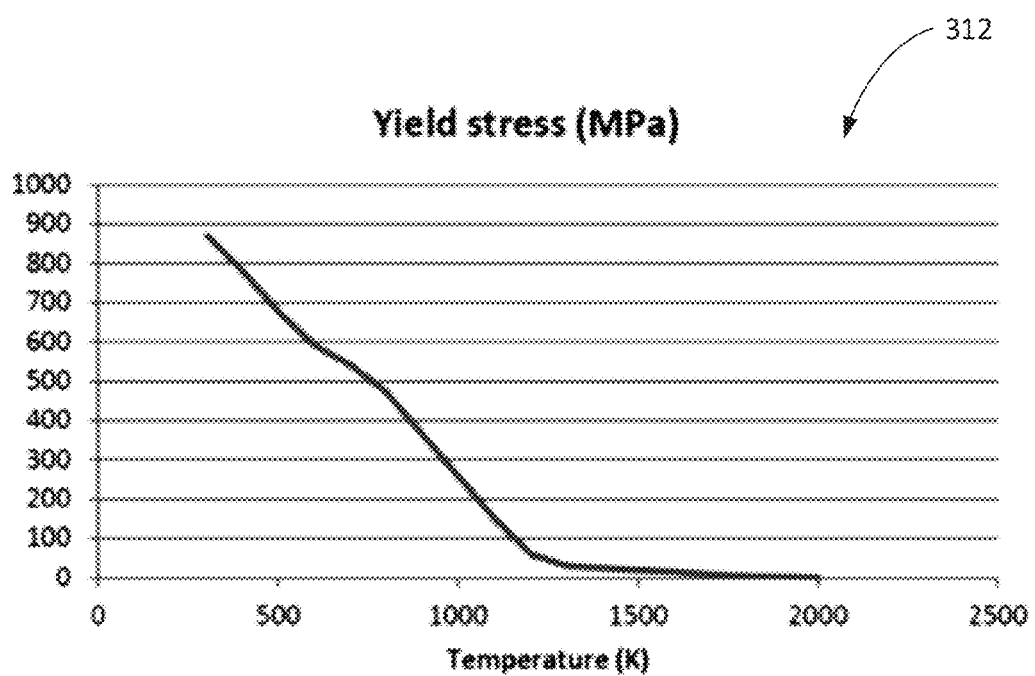
FIG. 11 is a plot of empirically derived temperature dependent flow stress data of the substrate and deposited material of the workpiece shown in FIGS. 5 and 6, the plot being included in a yielding behaviour element of the Finite Element Analysis (FEA) model forming part of the software module of the computer system of FIG. 3.

In more embodiments, the yielding behaviour element follows the von Mises criterion, which suggests that the yielding of materials begins when the second deviatoric stress invariant reaches a critical value. Initially, the Johnson-Cook model is employed to describe the evolution of yield, however the Applicants have determined the Johnson-Cook model to be inadequate to describe the yielding behaviour of Ti-6Al-4V alloy, and other metal alloys, at elevated temperatures. Moreover, a sensitivity analysis carried out by the Applicants indicates the effects of strain hardening and strain rate on post-build distortion is negligible for metal alloys, allowing a simpler, empirical temperature depending flow stress to be used in the FEA model 254. Accordingly, the yielding behaviour element follows empirically derived temperature dependent flow stress data, as depicted in the exemplary plot 312 in FIG. 11.

Material Deposition Element

There are many complex fluid flow and heat processes taking place during material deposition. In preliminary work carried out by the Applicants, modelling of melted deposit material was included in this model element. However, it has been determined that a simpler, less computationally intensive strategy can be adopted without losing accuracy. The modelling strategy now being adopted by the material deposition element is to model material deposition at the liquidus temperature (of 1923 K (1650° C.)) or slightly above the liquidus temperature with a small amount of superheat. The height and width of each deposit layer, and the rate and direction of deposition are set to reasonably approximate the actual characteristics of the build.

Solidification Element

Solidification of the deposited metal is modelled as occurring uniformly over a 45 K range between a solidus temperature of 1878 K (1605° C.) to a liquidus of 1923 K (1650° C.). The latent heat in this example is 269.5 kJ/kg.

Alternatively, the material deposition element models material deposition to simulate melting of the material from an energy/heat source having a known power level.

Substrate Preheating Element

In one or more embodiments, the electron beam can be used to preheat the substrate. This can be modelled as a moving volumetric heat source within the substrate. At any time, this heat source can be modelled as an ellipsoidal region with a volumetric input distribution which integrates to a specified heat flux from the electron beam. This ellipsoid source moves corresponding to the motion of the electron beam. The volumetric heat input (power per unit volume) is given by:

$$q_f = \frac{6\sqrt{3f_f}Q}{abc_f \pi^{3/2}} \exp\left(\frac{-3x^2}{a^2}\right) \exp\left(\frac{-3y^2}{b^2}\right) \exp\left(\frac{-3z^2}{c_f^2}\right)$$

$$q_r = \frac{6\sqrt{3f_r}Q}{abc_r \pi^{3/2}} \exp\left(\frac{-3x^2}{a^2}\right) \exp\left(\frac{-3y^2}{b^2}\right) \exp\left(\frac{-3z^2}{c_r^2}\right)$$

where Q=ηP, with P being the nominal power input and η is the efficiency with which this is transferred to the workpiece. The parameters $f_f$, $f_r$ are given by:

$$f_f = \frac{2}{(1 + c_r/c_f)}, f_r = \frac{2}{(1 + c_f/c_r)},$$

so ensuring that the integrated heat input over the ellipsoidal region is Q.

By way of example, the particular values that have been used by the Applicants in the modelling of a T-shaped workpiece are:

a=7.1 mm, b=4 mm, $c_f$=3 mm, $c_r$=5.9 mm
η=0.7

The power P and the velocity of the source are as specified by the build parameters.

During a physical or actual build, the substrate is typically placed in a fixture of some kind for the purposes of mechanical support and constraint. This fixture also acts as a thermal chill to workpiece being fabricated. The Applicants have previously explicitly modelled and included the fixture as part of the computational finite element analysis model 254. However, this has the disadvantage of significantly adding to the size and running time of the model. For this reason, the FEA model 254 adopts a simpler approach whereby the mechanical properties of the fixture are approximated by explicit constraints applied to the simpler T-shape base case geometry depicted in FIGS. 5 and 6. The chilling effect of the fixture is then approximated by an effective heat transfer coefficient.

The data 252 characteristic of the fabrication steps/conditions can also define a number of set-up parameters that the Applicants have determined to have an impact on the shape distortion and residual stress development in the workpiece during and after fabrication. These parameters include:

1. The level of preheat of the substrate plate before the build.
2. Heat transfer from the workpiece during the build. This includes both investigating the sensitivity to the exterior heat transfer boundary condition parameters, as well as the degree of interior heat transfer to the fixture, particularly through the clamping configuration.
3. The deposition speed and the cooling time between the deposition of each layer.
4. Pre-bent substrate to compensate for post-build distortion-free "straight" part can be achieved.
5. The sequencing of the build in each layer.

The fabrication step/conditions 254 may additionally characterise the following fabrication steps, each of which have been found to minimise heat loss occurring during fabrication and therefore minimise shape distortion and/or residual stress development occurring in the workpiece:

Minimising heat loss from the substrate and the deposited material during one or more of the fabrication stages by not cooling the workpiece during deposition of successive of material. For example, it has been found desirable if the average temperature of the workpiece is prevented from falling by 10% between deposition of successive layers of material.

Minimising heat loss from the substrate and the deposited material during one or more of the fabrication stages by applying insulation to the workpiece during fabrication. Insulation may be applied to the workpiece by applying insulating material between the substrate and the table upon which the substrate is supported during fabrication.

Minimising heat loss from the substrate and the deposited material during one or more of the fabrication stages by applying radiation reflection to the workpiece.

Moreover, the fabrication steps/conditions 254 may include parameters found by the Applicants to minimise or avoid critical residual stress development in the workpiece by controlling mechanical boundary conditions during one or more of the fabrication stages by controlled reduction clamping forces used to hold the substrate to the supporting table as the fabricated workpiece cools so as to minimise or avoid crack formation.

From the foregoing it will be apparent that a modelling technique accounting for multi-physics phenomena has been successfully developed to simulate the EBFFF process. This predictive tool gives insights into the evolution of temperature and internal stress distribution throughout a workpiece during and post build, as well as the final overall distortion and residual stress.

This modelling technique has been validated for a number of T-shaped parts and cross-shaped parts. Agreement between model prediction and experimental measurements has been good in preliminary development and excellent after the modelling tool was refined, giving high confidence in the predictive capability of the tool, both in the design and manufacturing stages.

The model has been effectively used to perform a series of virtual Design of Experiments in order to assess how the overall distortion is influenced by various operating parameters and conditions, build paths, preheated or preformed substrate and their combinatorial effects.

The model reveals that post build distortion is extremely sensitive to energy input (electron beam power) and thermal boundary conditions such as the heat sink effect of clamps and time interval between passes (cooling).

For the T-shaped part, it has been found that a pre-bent substrate is an effective distortion management approach and is able to almost completely compensate for distortion for simple shapes.

Simply insulating the clamps was predicted to be able to significantly reduce distortion and experimental measurements have shown that a reduction of 34% can be achieved.

The model predicted that preheating of the substrate without maintaining it during the build was not very effective in reducing distortion. Combining preheat (500° C.) with insulated clamps and halving the build speed was predicted to reduce distortion by 39%, only marginally higher than the case with no preheat but insulated clamps. Furthermore, preheating of the substrate to such high temperatures introduces operational difficulties and not a preferred option for the manufacturer.

The predictive tool enables evaluation of the effects of hypothetical operating conditions such as very high preheat temperatures and combinatorial effects on post build distortion and residual stress, even though they seem impractical at present.

The developed modelling technique and the predictive tool can be extended to other additive manufacturing process, notably processes in which workpieces are fabricated using layers of nickel, aluminium and titanium metals and metal alloys.

Experimental Plan

The following description refers to the experimental design and validation in relation to additive manufacturing of T-shaped and cross-shaped workpieces using a titanium alloy, but it will be appreciated that the described embodiments can be used in the context of additive manufacturing using other metals, metal alloys and like materials.

The simulations for the development and validation of the predictive tool for distortion and residual stress development during and after build was performed primarily employing a general-purpose, nonlinear finite element analysis solver, using appropriate process parameters. In the initial stage, effort also included meshing techniques to create FEM models that describe the deposition paths. Some customization of the solver for this specific application was found to be necessary.

The building of demonstration parts selected for model calibration and validation was contracted to two different companies. The T-shaped part required deposition only one side of the substrate plate, while the cross-shaped part required deposition on both sides of the substrate. This was achieved by using a flip table. Distortion measurements were carried out using a 3D scanner. Residual stress measurements by neutron diffraction technique were carried out on selected builds.

Output modelling results were then compared with experimental residual stress and distortion data for the purposes of both model calibration and validation. Model results provide an understanding of the evolution of temperature, deformation and stress in the built part during and after additive manufacturing. The model was then employed in a predictive Design of Experiments mode to investigate the effects of various tool paths and process parameters on the (post-manufacturing) part distortion and residual stress.

Company A built a number of one-sided T-shaped and two-sided cross-shaped parts while Company B built four one-sided T-shaped parts. The substrate Ti-6Al-4V plate was 2 ft. (600 mm) long, 4 in. (100 mm) wide and 0.5 in. (12.5 mm) thick. The deposit was 2 in (51 mm) high and comprised a single bead, 0.472 in (12 mm) wide. FIGS. 12(*a*) and (*b*) respectively show schematic illustrations 314 and 318 of the exemplary of the T-shaped and cross-shaped parts. The T-shaped part required deposition only one side of the substrate plate, while the cross-shaped part required deposition on both sides of the substrate. This was achieved by using a flip table. Table 1 below presents the EBFFF process parameters used by the two technology providers to produce the builds.

TABLE 1

|  | Company A | Company B |
|---|---|---|
| Accelerating voltage (kV) | 40 | 130 |
| Beam Current (mA) | 215 | 10 |
| EB power (kW) | 8.6 | 1.3 |
| Wire diameter (in) | 0.125 | 0.063 |
| Linear Travel Speed (lpm) | 30 | 9.85 |
| Wire Feed Rate (lpm) | 127 | — |
| Deposition rate (lb/h) | 15 | 1.34 |
| Number of runs per layer | 1 | 2 |
| Layer thickness (mm) |  | 1.5 |
| Build layers | 18 | 35-37 |
| Cooling between layers | Varies: 19-60 s | $1^{st}$ path: 70 seconds<br>$2^{nd}$ path: varies 85-1028 s |

The substrate clamping arrangements used profoundly influence the thermal boundary conditions for the builds. Companies A and B used different clamping arrangements. Company A also used different clamping conditions for the one-sided and two-sided builds. For the one-sided builds, they used a rotary table with a steel face plate, and clamping was done at four points via an aluminium bar along the substrate length. For the double-sided builds, Company A utilized an aluminium head and tail stock "Flip Table" to rotate the part about its centerline. The substrate plate clamped was along its long dimension using aluminium bars and spring loaded clamps, with each clamp loaded to 500 lbs based on spring rate information. Two thermocouples were attached at each end of the substrate plate, close to the build to monitor the thermal history during the build. At Company B, a fixture plate was machined out of AA 5083 aluminium alloy to hold the coupons while processing. The fixture was in turn held on a vice mounted on the X-Y CNC table within the vacuum chamber. Five thermocouples, two at the start and end of build, respectively, and three at build centre were used.

Distortion measurements were conducted by scanning various builds using a portable 3D scanner. The term "distortion" is used in this context as the average of two vertical distances measured between the central point to the uplifted edges of the substrate base.

Residual stress measurements were made using a neutron diffraction technique on a plane at the centre along the longitudinal direction of the substrate plate. As titanium gives a relatively weak diffracted signal, neutron measurements tend to be lengthy. In the beam time available, measurements were made along three directions 318, 320 and 322 (longitudinal, transverse, and normal, various points along a part 324, as shown in FIGS. 13(a)-(c).

Figure 13:
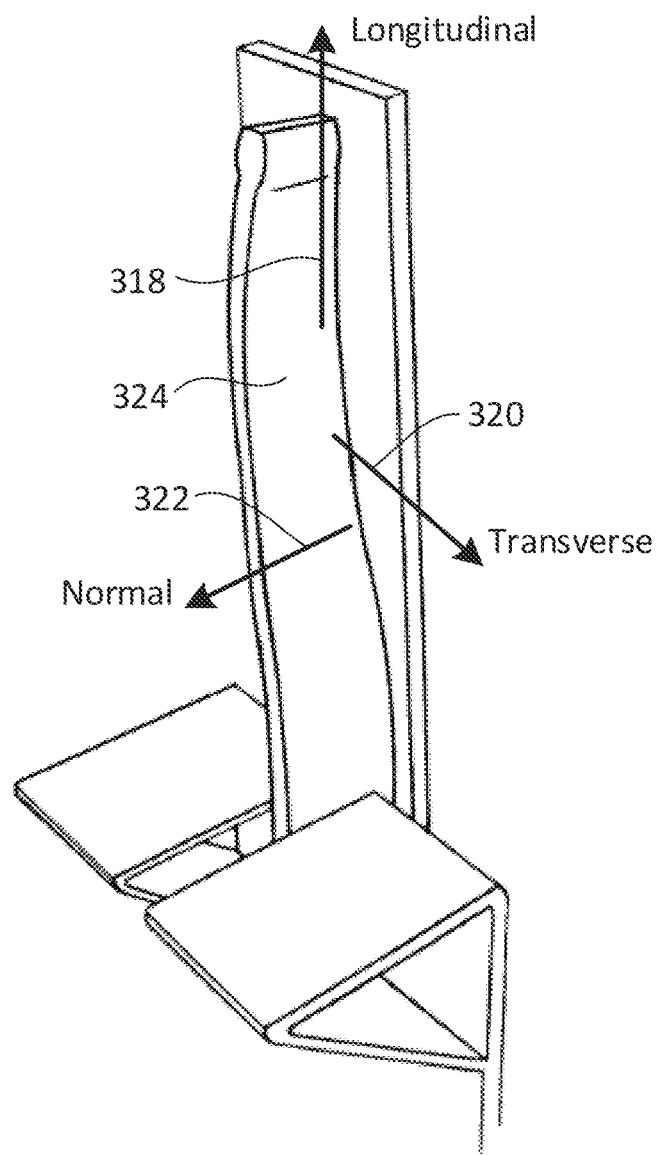
FIG. 13(a) depicts a layout for measuring normal residual stress in the workpiece shown in FIG. 12.
FIGS. 13(b) and (c) depict locations of points for residual stress measurements carried out using the layout shown in FIG. 13(a)

FIG. 13(a) depicts a normal residual stress measurement layout in which neutrons come from a primary slit (on right) and the diffracted neutrons are collected by a secondary slit visible behind the sample. FIGS. 13(b) and (c) respectively depict plots 326 and 328 showing locations of points for residual stress measurements in Company A one-sided T-shaped joints and Company B one-sided T-shaped joints.

Model Set-Up

In order to carry out model validation and calibration, the Applicants required actual measurements of quantities that could be compared with model predictions. Three kinds of measurements were used for this purpose:

1. Measurement of the final distortion employing a portable 3D scanner. This involved measurement of the relative vertical displacement of the substrate at the end of the build once the workpiece had cooled down to room temperature and all mechanical constraints had been released.

2. Measurement of the final residual stress. These measurements were undertaken using neutron diffraction.

3. Continuous temperature data during the build. For the Company B builds, five thermocouples were spot-welded at prescribed locations on the base plate and temperature data was collected continuously during the build and cooling period. As mentioned previously, limited temperature data was also collected from some of the Company A builds; however, this was found to be unreliable due to the poor thermal contact between the thermocouples and the substrates.

Since some of the setup and process parameters of the model were uncertain, an assessment was made of how sensitive the model predictions were to changes in these parameters. This kind of analysis also gave an indication of how sensitive the actual build is likely to be these parameters, and in this way gives some insight to which of these might be potential approaches to manage final distortion. Such computational sensitivity studies therefore also play the role of virtual experiments. Some of the setup parameters that were investigated included the following:

1. The level of preheat of the substrate plate before the build.

2. Heat transfer from the workpiece during the build. This includes both investigating the sensitivity to the exterior heat transfer boundary condition parameters, as well as the degree of interior heat transfer to the fixture, particularly through the clamping configuration.

3. The deposition speed and the cooling time between the deposition of each layer.

4. Pre-bent substrate to compensate for post-build distortion-free "straight" part can be achieved.

5. The sequencing of the build in each layer.

Table 2 below gives details of the sensitivity studies and virtual design of experiments that were carried out for the Company A build. The base case referred to is described in Table 3 below.

TABLE 2

| 1 | Base case | Default Company A build parameters. See Table 3.2 below. |
|---|---|---|
| 2 | Substrate preheat (250° C.) | Substrate is given initial temperature of 250° C. |
| 3 | Substrate preheat (500° C.) |  |
| 4 | Cooled to below 100° C. | After each layer is deposited, the part is allowed to cool to below 100° C. before the next layer is started. |
| 5 | Cooled to below 400° C. | Same as above, but cooled to below 400° C. |
| 6 | No cooling between layers | The deposition of each layer starts immediately after the previous one is finished. |
| 7 | Clamps are insulated | The radiation condition was replaced by a fully insulated condition where the clamps were located. (Note that, as for the base case, the clamps are not modeled explicitly.) |

TABLE 2-continued

| | | |
|---|---|---|
| 8 | Clamps are a heat sink | This case actually included the clamps in the thermal model, with dynamic thermal contact to the substrate; thus, the clamps act as a heat sink. This case is "closest" to the actual configuration of the build. |
| 9 | Substrate thickness 5.5 mm | In the base case, the substrate is 12.5 mm thick |
| 10 | Substrate thickness 22 mm | |
| 11 | No substrate | Deposition is modeled as if there were no substrate (in effect, a very thin substrate) |
| 12 | Pre-bent substrate | Pre-bend is equal and opposite of base case final distortion |
| 13 | Pre-bent substrate, 7.33 mm thickness | Same pre-bend, but for a thinner substrate |
| 14 | Build speed 50% | Speed of deposition is half of base case; delay between layers is the same as base case. |
| 15 | Build speed 200% | |
| 16 | Build width 50% | Width of build reduced to half of base case. |
| 17 | Build sequence ACBD | Each layer was divided into four equal sections, denoted in order A, B, C and D. The base case build deposited each layer in the sequence ABCD. In this build the sequence was ACBD; i.e. first quarter, then jump to third quarter, then back to second quarter, then jump to final quarter. |
| 18 | Build sequence BCAD | A different modified sequence for each layer—middle two quarters in order, then first quarter, then jump to final quarter. |
| 19 | Build thickness 50% | 36 layers deposited, each of 50% of thickness of base case. |
| 20 | Build thickness 200% | 9 layers deposited, each of 200% of thickness of base case. |
| 21 | Preheat + insulation | Substrate preheat of 500° C. and insulated clamps |
| 22 | Preheat + 50% build speed | Substrate preheat of 500° C. and 50% build speed |
| 23 | Preheat + insulation + 50% build speed | Combination of 21 and 22 |

TABLE 3

| | |
|---|---|
| Substrate | 600 mm long, 12.5 mm thick, 100 mm wide |
| Deposit | 560 mm long, 51 mm high, 12.5 mm wide (single bead) |
| Process parameters | Speed: 12.7 mm/s E-beam power: 4.3 kW (used for preheat only) Layers: 18 layers, each 2.83 mm height; delay between layers as per Company A Initial temperature of substrate: 30° C. Weld material deposited at liquidus 1650° C. (no superheat) |
| Cooling | Radiation from all exterior surfaces |
| Constraints | Base plate is restrained before release and springback, but clamps are not otherwise explicitly included in the model, so as to reduce computation time |

Experimental Results

Details of the experimental builds produced by Company A and Company B are presented in Table 4 below. In total, 20 builds were produced by Company A including 5 double-sided builds, while 4 one-sided T-shaped builds were produced by Company B. The results of the distortion measurements are also presented in Table 3.1. Although nominally identical build parameters and conditions were used by Company A and Company B to produce the four builds for each case, it is seen that there is some scatter in the measured distortion. It is also evident that the Company B builds display much higher distortion and higher scatter in the measure distortion. Selected samples were subjected to a standard stress-relief heat treatment; as can be seen from Table 4, this seemed to result in a slight increase in average distortion, but it is possible that this is within the experimental scatter associated with distortion measurement by 3D scanning.

TABLE 4

| DESCRIPTION OF BUILDS | DISTORTION AT EDGE 1 (MM) | DISTORTION AT EDGE 1 (MM) | AVERAGE DISTORTION (MM) | COMMENTS |
|---|---|---|---|---|
| Company A baseline one-sided T-shaped part | | | | |
| F-7053-A | 5.21 | 5.45 | 5.33 | Mean for 2 builds (mm): 5.03 ± 0.43 |
| F-7053-B | 4.4 | 5.04 | 4.72 | |
| F-7053-C | — | — | — | Not measured |
| F-7053-D | — | — | — | Not measured |
| Company A one-sided T-shaped part; direction of travel changed after each run | | | | |
| AA-18-9-2012 | 5.74 | 6.58 | 6.16 | Mean for 4 builds (mm): 5.63 ± 0.53 |

TABLE 4-continued

| DESCRIPTION OF BUILDS | DISTORTION AT EDGE 1 (MM) | DISTORTION AT EDGE 1 (MM) | AVERAGE DISTORTION (MM) | COMMENTS |
|---|---|---|---|---|
| BB-19-9-2012 | 5.31 | 6.57 | 5.94 | |
| CC-19-9-2012 | 5.64 | 5.29 | 5.47 | |
| DD-20-9-2812 | 5.38 | 4.53 | 4.96 | |
| Company A one-sided T-shaped part; insulated ceramic clamps ||||| 
| AAA-27-02-2013 | 3.73 | 3.72 | 3.73 | Mean for 4 builds (mm): 3.33 ± 0.43 |
| BBB-06-03-2013 | 3.15 | 3.82 | 3.49 | |
| CCC-06-03-2013 | 3.23 | 2.2 | 2.72 | |
| DDD-06-03-2013 | 2.67 | 4.08 | 3.38 | |
| COMPANY B one-sided T-shaped part ||||| 
| Build 1 | 9.09 | 8.06 | 8.58 | Mean for 4 builds (mm): 8.81 ± 1.33 |
| Build 2 | 7.04 | 7.79 | 7.42 | |
| Build 3 | 7.92 | 9.28 | 8.60 | |
| Build 4 | 10.17 | 11.07 | 10.62 | |
| Stress-relieved builds | Vacuum Heat Treat Heat to 1200° F. +/− 25° F. for 3 hours +/− 0 minutes Argon gas cool to below 250° F. +/− 25° F. Cool to room temperature ||||
| F-7053C | 5.61 | 5.58 | 5.60 | |
| CC-9-19-12 | 5.39 | 5.99 | 5.69 | 5.47 mm, as-built |
| BBB-06-03-2013 | 3.815 | 3.43 | 3.62 | 3.49 mm, as-built |
| Pre-bent substrate builds ||||| 
| F-7176-14-8-2013-A | 4.51 | 5.64 | 5.075 | Pre-bent substrate, but clamped straight |
| F-7176-14-8-2013-B | −3.16 | 0.45 | −1.355 | Pre-bend of 5.1-5.6 mm |
| F-7176-15-8-2013-C | −1.38 | −2.95 | −2.165 | |

Model Validation

Figure 14:
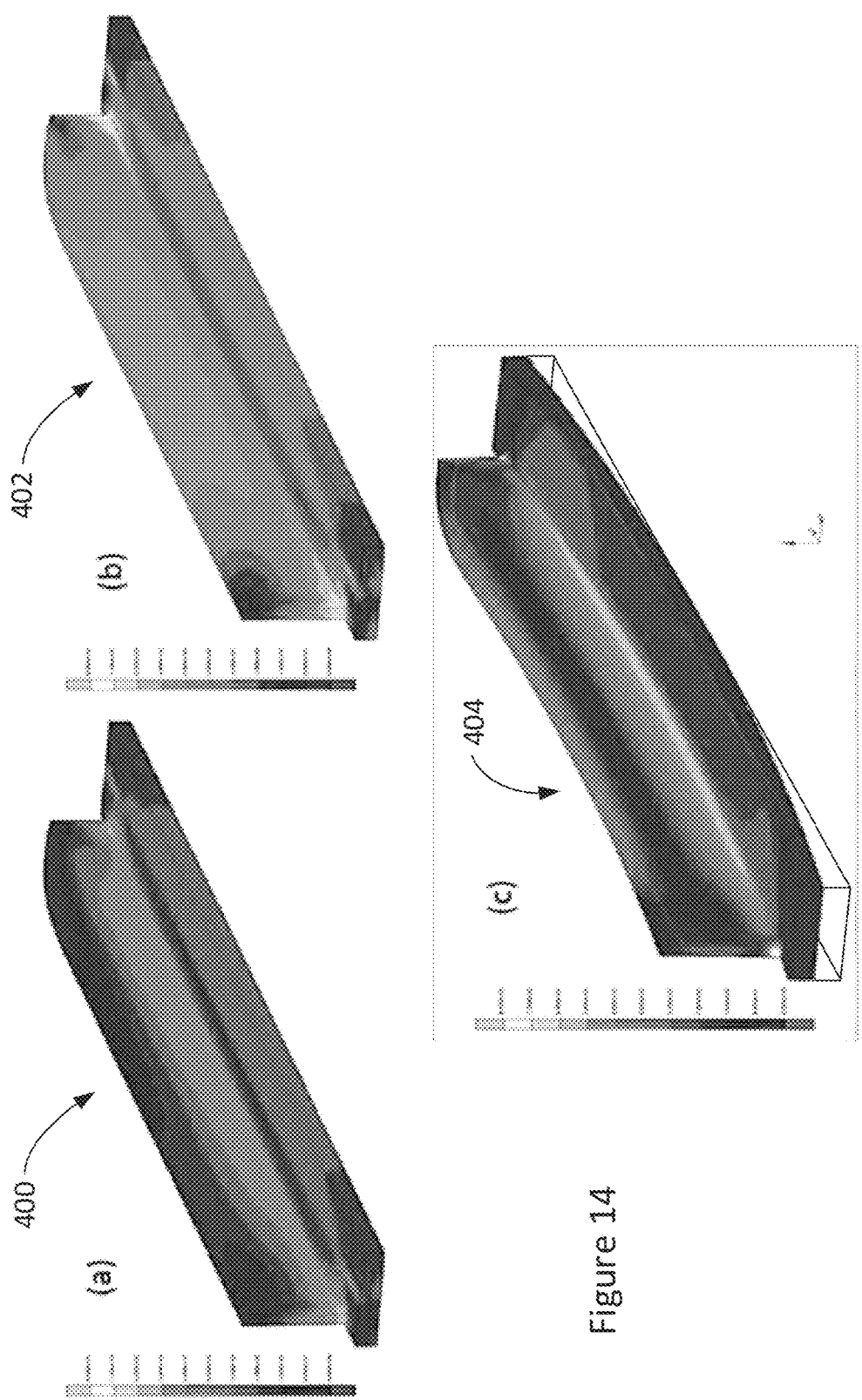
FIGS. 14(a) to (c) shows three "heat maps" depicting the predicted evolution of von Mises stress at the completion of the build deposition, after cooling and after an exemplary T-shaped workpiece fabricated by the apparatus of FIG. 1 was released from clamps.

FIG. 14 shows three "heat maps" 400 to 404 depicting the evolution of von Mises stress (a) at the completion of the build deposition, (b) after cooling to below 100° C. in the chamber, and (c) after the specimen was released from clamps. A substantial increase in stress was observed when the specimen cooled down, while still being clamped, notably very high stress concentration at the substrate top surface adjacent to the deposit ends. However, stress reduced when the clamps were released and distortion appeared.

Figure 15:
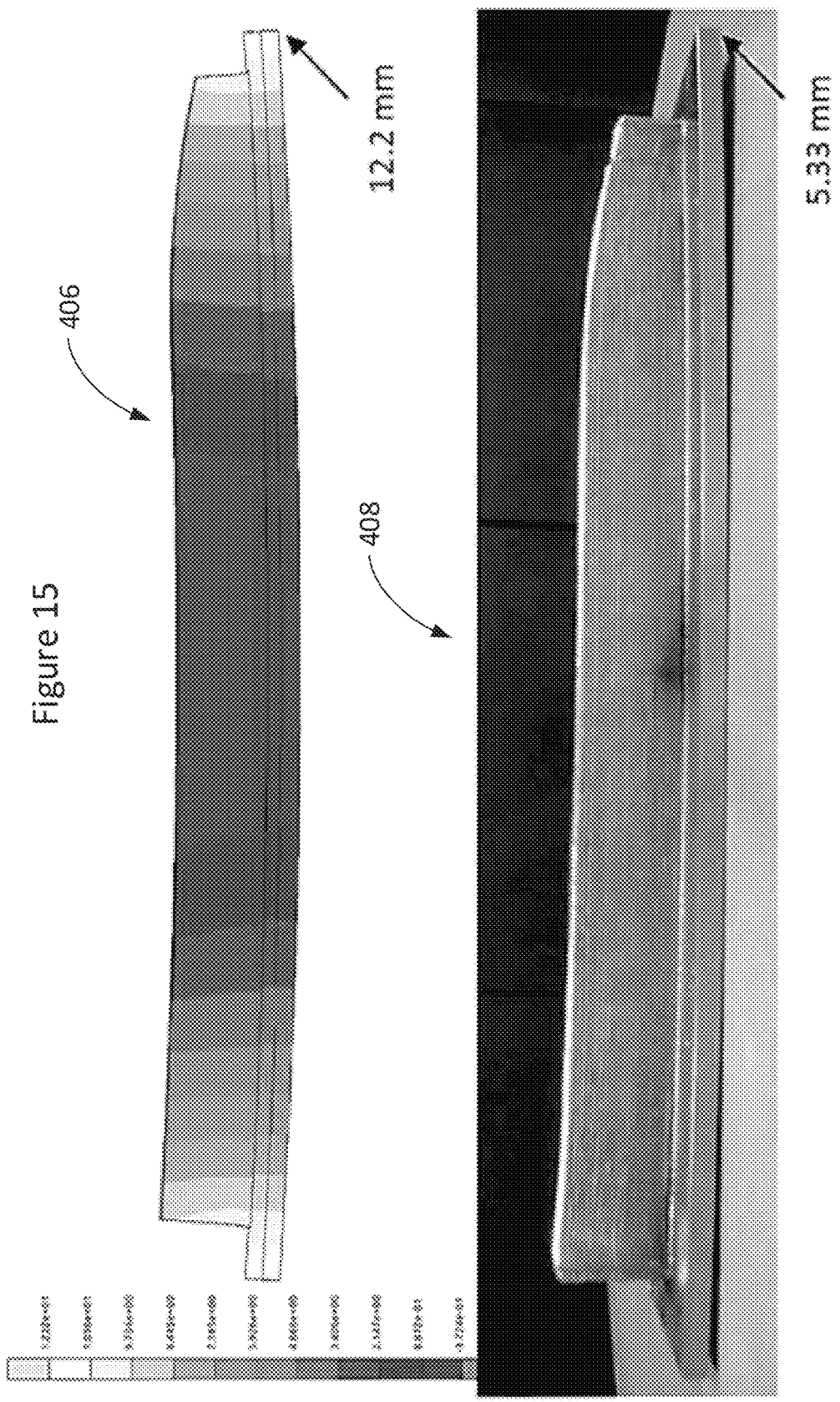
FIG. 15 shows the comparison of post-build distortion as predicted by modelling performed by the computer system of FIG. 3 and represented by a "heat map" (and depicted in FIG. 14) and as measured on the experimental build and represented by an image of the build.

FIG. 15 shows the comparison of post-build distortion as predicted by modelling and shown in "heat map" 406 and as measured on the experimental build as shown in image 408. The model predicted a final distortion close to 12 mm whereas 3D scan measurement shows a distortion of 5.33 mm for the corresponding specimen (F-7053-A in Table 4). This discrepancy was mainly due to the inability of the Johnson-Cook model to adequately describe the yielding behaviour of Ti-4Al-6V alloy at elevated temperatures.

Figure 16:
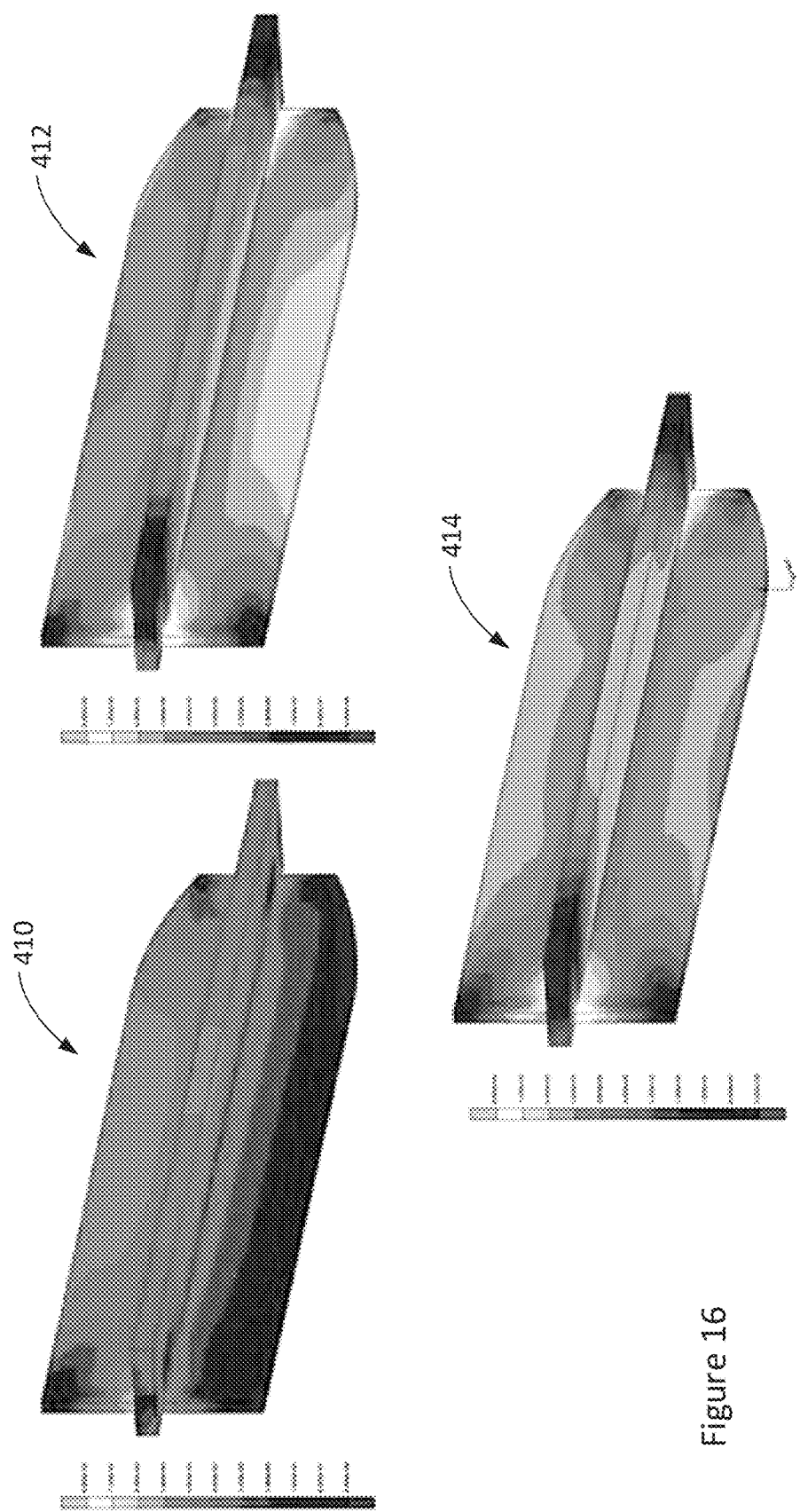
FIGS. 16(a) to (c) shows three "heat maps" depicting the predicted evolution of von Mises stress at the completion of the build, after cooling and after an exemplary X-shaped workpiece released from clamps.

FIG. 16 shows three "heat maps" 410 to 414 depicting the predicted evolution of von Mises stress (a) at the completion of the build, (b) after cooling to below 100° C., and (c) after the specimen was released from clamps. A substantial increase in stress was observed when the specimen cooled down, again notably at the substrate surfaces adjacent to the two deposit ends. However, reduction of stress did not occur when the specimen was released from the clamps as in the case of one-sided build.

Figure 17:
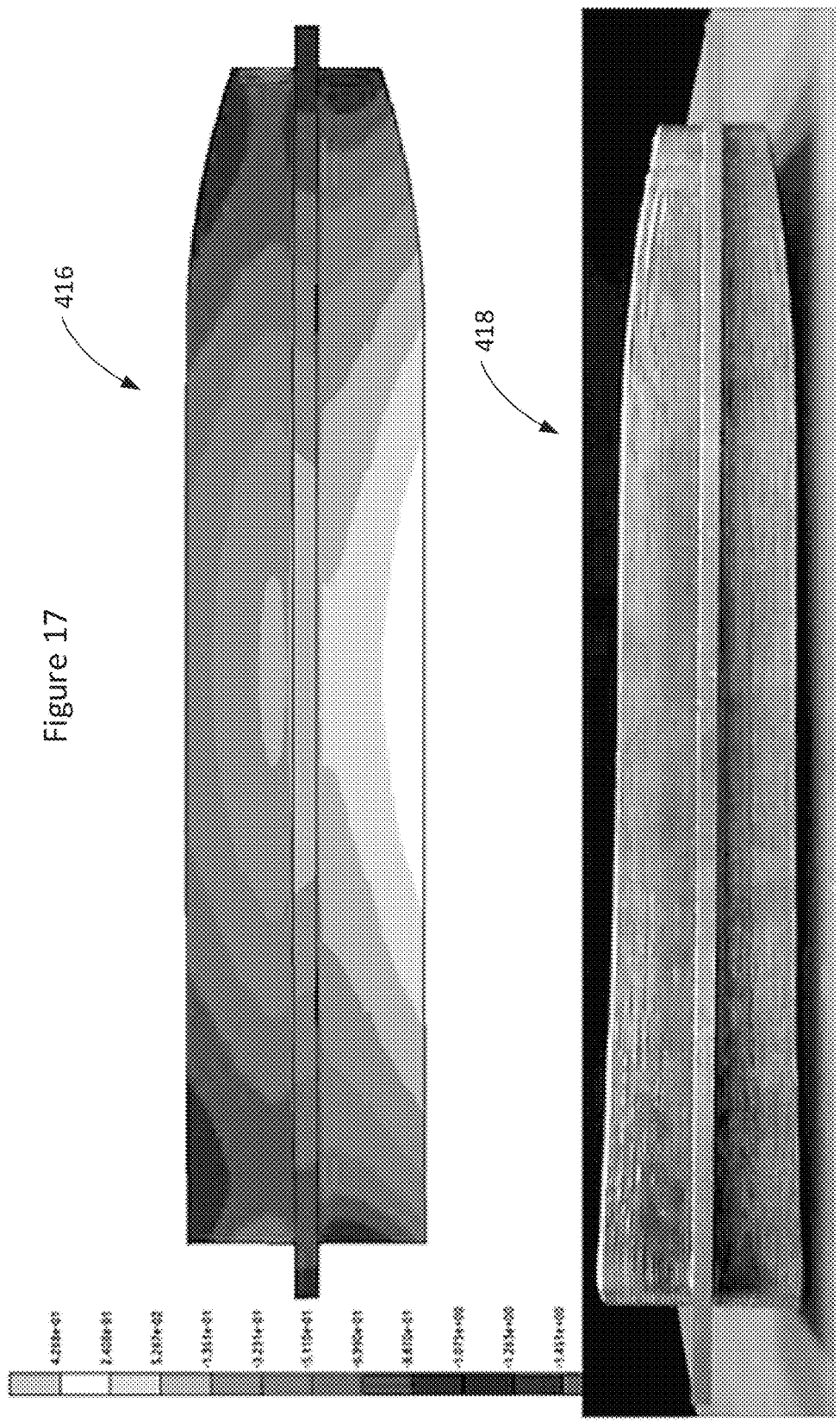
FIG. 17 shows the comparison of post-build distortion as predicted by the model performed by the computer system of FIG. 3 and represented by a "heat map" (and depicted in FIG. 16) and as measured on the corresponding experimental build and represented by an image of the build.

FIG. 17 shows the comparison of post-build distortion as predicted by the model and as shown in a "heat map" and as measured on the corresponding experimental build and as shown in an image 418. Predicted distortion was in excellent agreement with experiment as both showed a very negligible amount of distortion (less than 0.5 mm). As mentioned above, the two-sided build resulted in close-to-balanced residual stress in the opposite deposits which helped to keep post-build distortion to a minimum. Double-sided deposition technique almost eliminates post-build distortion but residual stress will remain high.

While experimental results agreed in principle with modelling as shown above, improvement in accuracy of predictions was highly desired. Therefore, attempts were made to enhance the modelling tool since mid-2013. In this modelling procedure, thermal and mechanical analyses were coupled at every time step.

Figure 18:
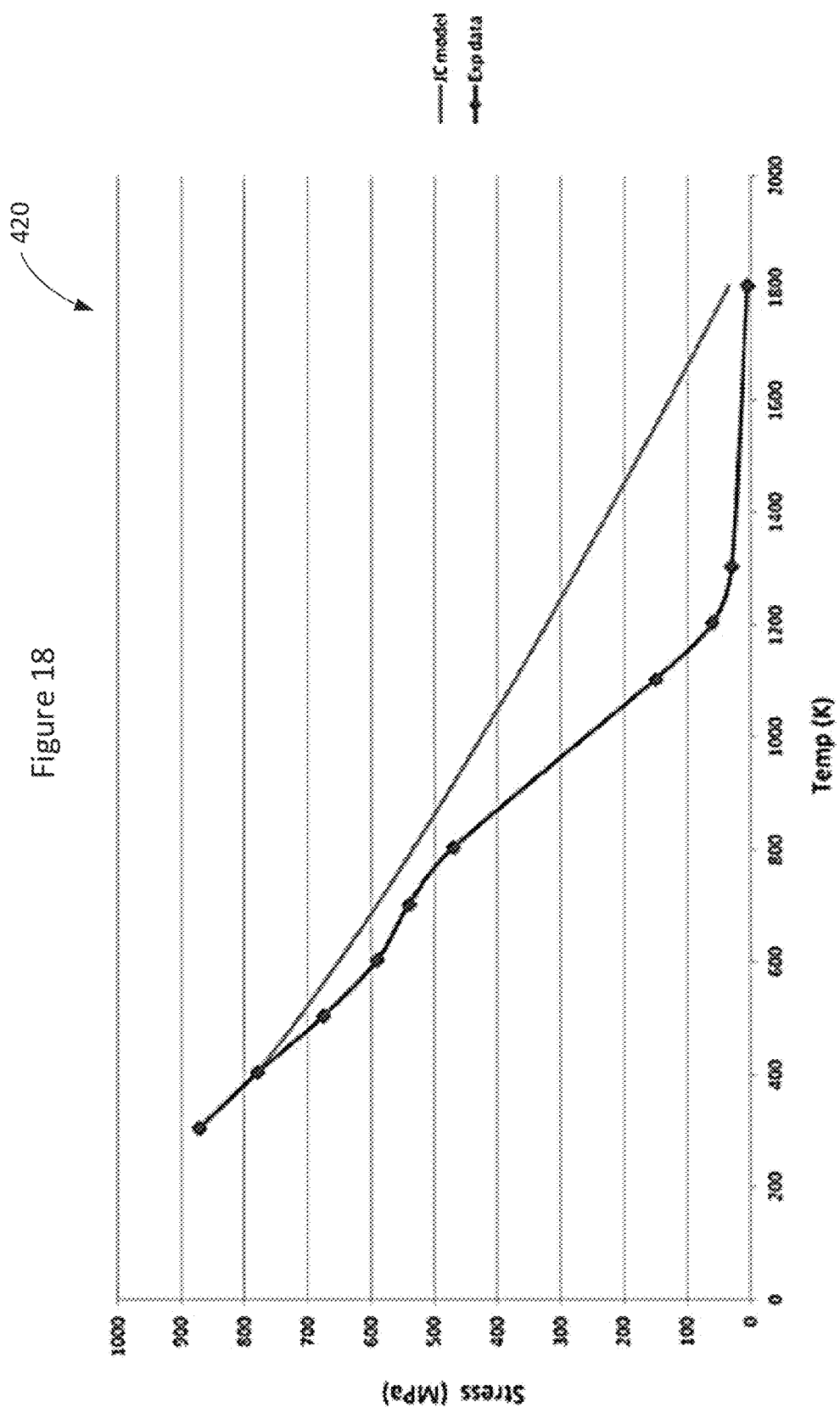
FIG. 18 shows plots of flow stress as a function of temperature based on the Johnson-Cook model versus collected experimental data.

As thermal analysis employed in this work was well-verified and validated against experiments in another project, attention was focused on the material models used. FIG. 18 is a graphical representation 420 depicting plots of flow stress as a function of temperature based on the Johnson-Cook model versus collected experimental data. Clearly, the Johnson-Cook model fails to describe the yielding behaviour of Ti-6Al-4V at elevated temperature.

Figure 19:
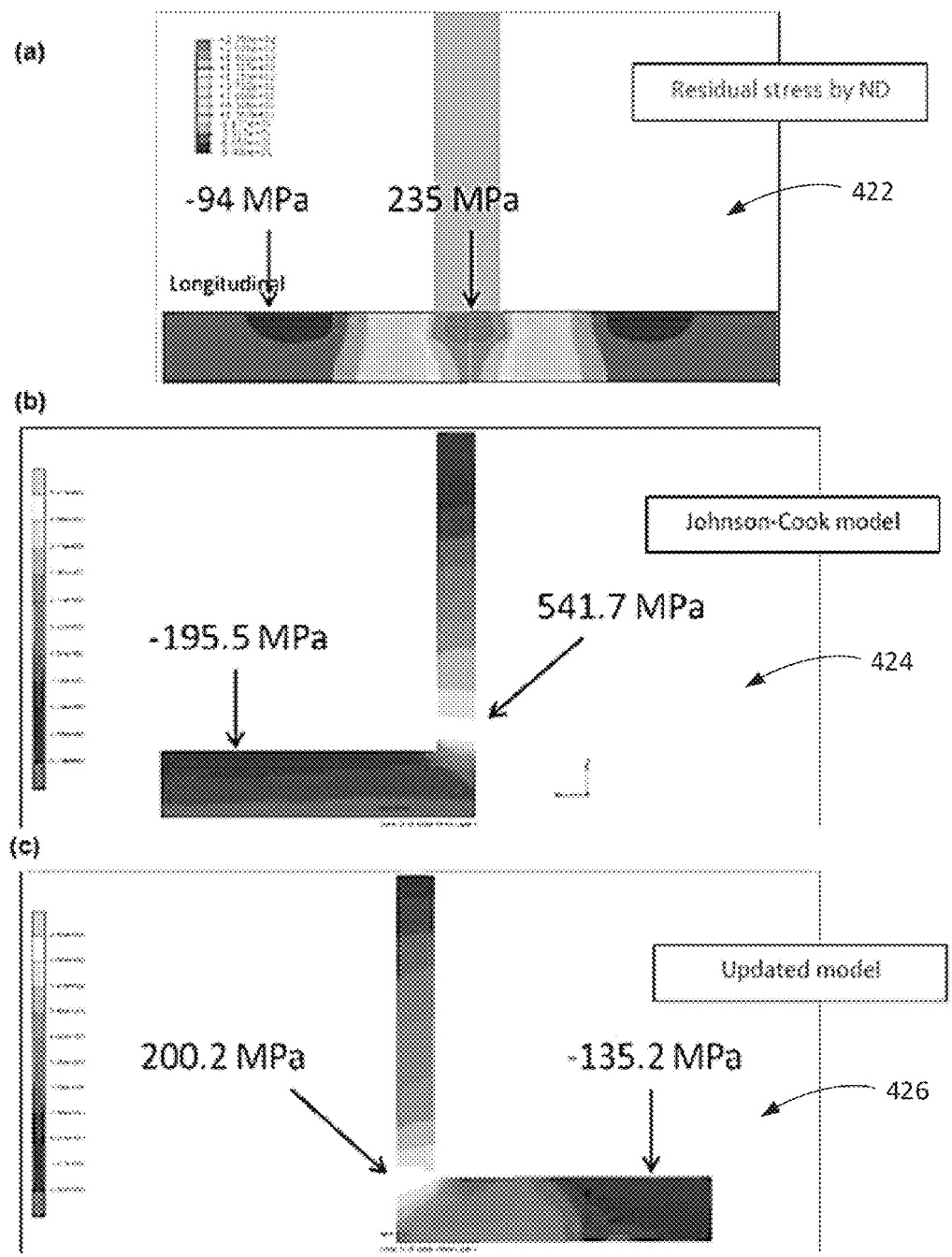
FIG. 19 shows "heat maps" of the longitudinal residual stress measured employing neutron diffraction and those predicted based on the Johnson-Cook model and an updated material model.

FIG. 19 depicts a "heat map" 422 showing shows the longitudinal residual stress measured employing neutron diffraction and "heat maps" 424 and 426 showing those predicted based on the Johnson-Cook model and the updated material model. It can be seen that prediction based on the Johnson-Cook model resulted in residual stress significantly higher than that measured whereas prediction based on the updated material model was in much better agreement with measurement, in terms of both stress distribution and magnitude.

Figure 20:
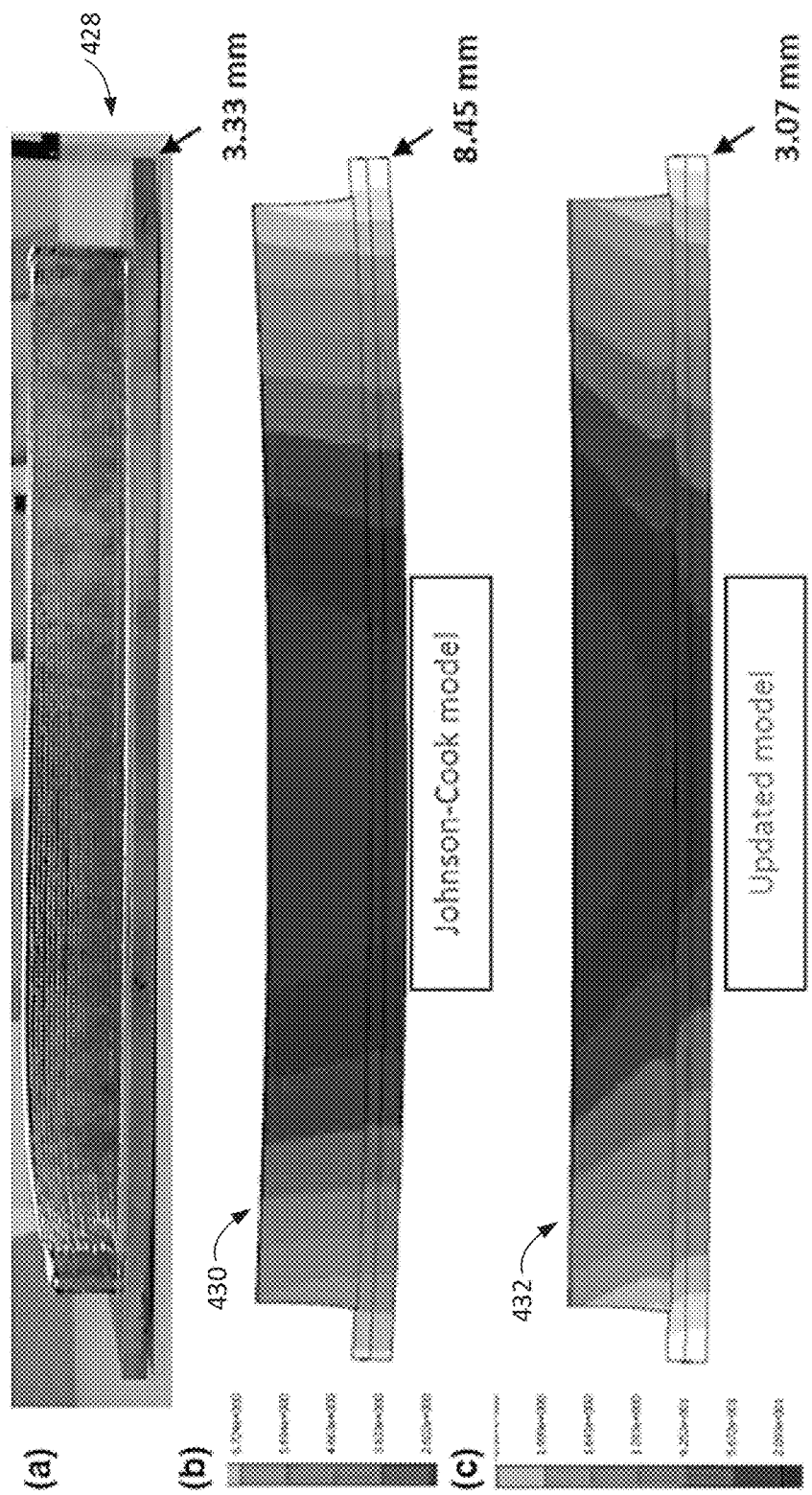
FIG. 20 shows an image of post-built distortion measured from experimental build and "heat maps" showing those predicted by modelling performed by the computer system of FIG. 3.

To verify the refined modelling tool, simulations were carried out for the experimental build having insulated clamps as this ensured more certainty of thermal boundary conditions. FIG. 20 includes an image 428 shows post-built distortion measured from experimental build and "heat maps" 430 and 432 showing those predicted by modelling. Modelling based on the Johnson-Cook model and the updated material model predicted distortion of 8.45 mm and 3.07 mm, respectively. 3D scan measurement shows an average distortion of 3.33 mm for 4 test specimens (see Table 4). The comparison between modelling and experiments confirmed prediction based on the updated material model was substantially improved in accuracy thereby increasing confidence in the predictive model tool, especially at the design stage.

Figure 21:
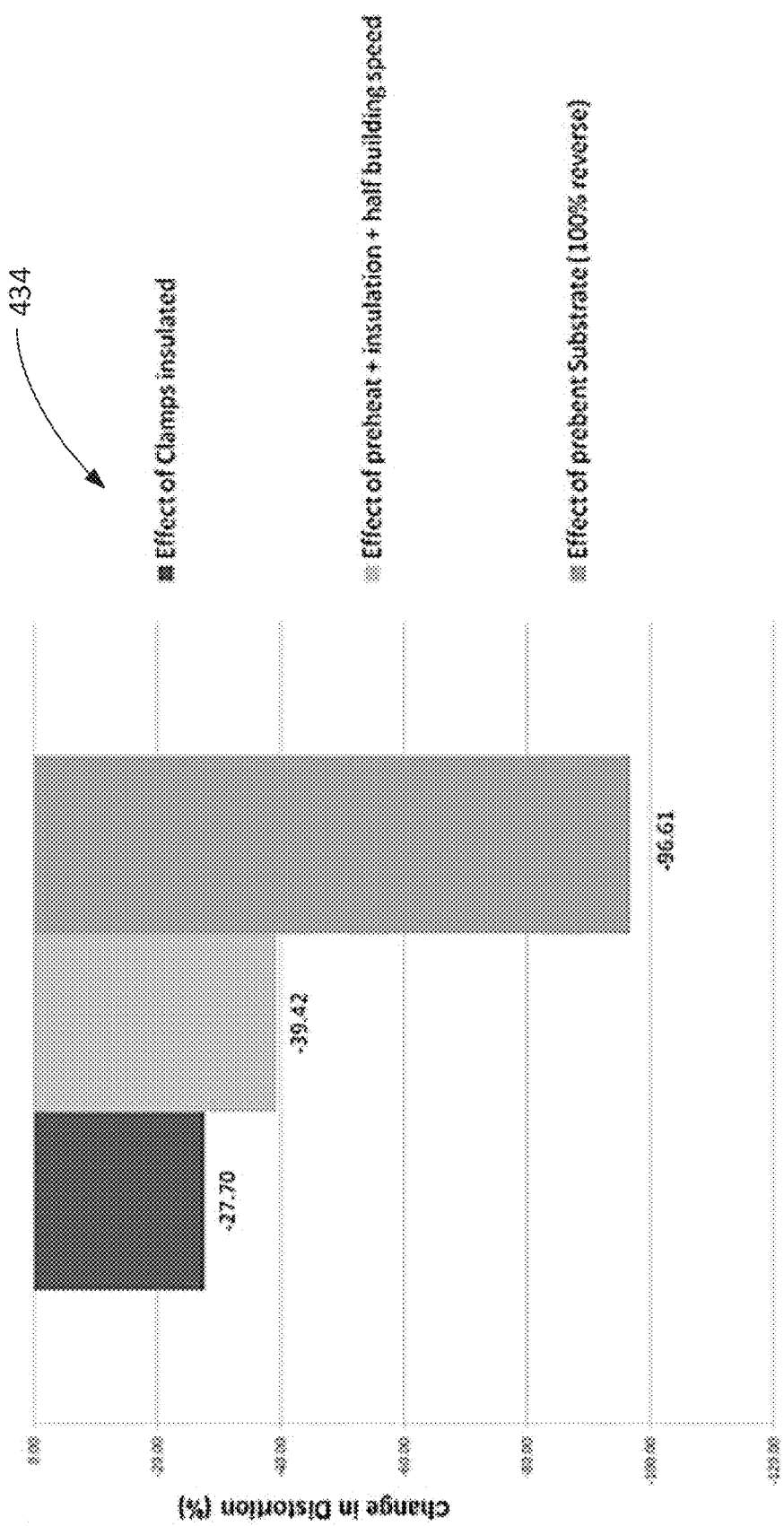
FIG. 21 is a graphical representation of the change in distortion of selected Design of Experiments results that were considered by the Applicants for experimental verification.

Virtual Design of Experiments was carried out employing the Johnson-Cook model as the updated model was not available at the time. The effects of various build scenarios such as varying process parameters, build sequences, build speeds, etc. (Table 1) on post-build distortion were virtually investigated with our developed modelling tool. FIG. 21 summarizes the results obtained from the virtual Design of Experiments, compared with the "real" baseline case corresponding to the experimental build with aluminium alloy clamps in place.

A significant reduction of 30.1 percent in post-build distortion was achieved by just insulating the clamps while more a more active approach such as the use of pre-bent substrates may fully eliminate post-built distortion. Other "extreme" approaches, such as active heating of the substrate to temperatures above 1300 K shows a large reduction in distortion but violates metallurgical constraints and is almost impossible to implement.

FIG. 21 shows a graphical representation 434 of change in distortion for selected Design of Experiments results that were considered for experimental verification. Due to delay in obtaining equipment to preheat substrate and scheduling constraints at Company A, the reduced distortion predicted for the combined effects of substrate preheat, insulated clamps and half the baseline building speed could not experimentally validated.

Four experimental one-sided builds with insulated (ceramic) clamps were subsequently produced by Company A, displaying an average post-build distortion of 3.33 mm (Table 4). Compared with an average post-build distortion of 5.03 mm for specimens clamped to the fixture via aluminium alloy bars, a reduction of 34 percent in post-build distortion was achieved using the ceramic insulated clamps, higher than that predicted by modelling (27.7 percent). This discrepancy may be attributed to the previously mentioned limitation of the Johnson-Cook model.

Figure 22:
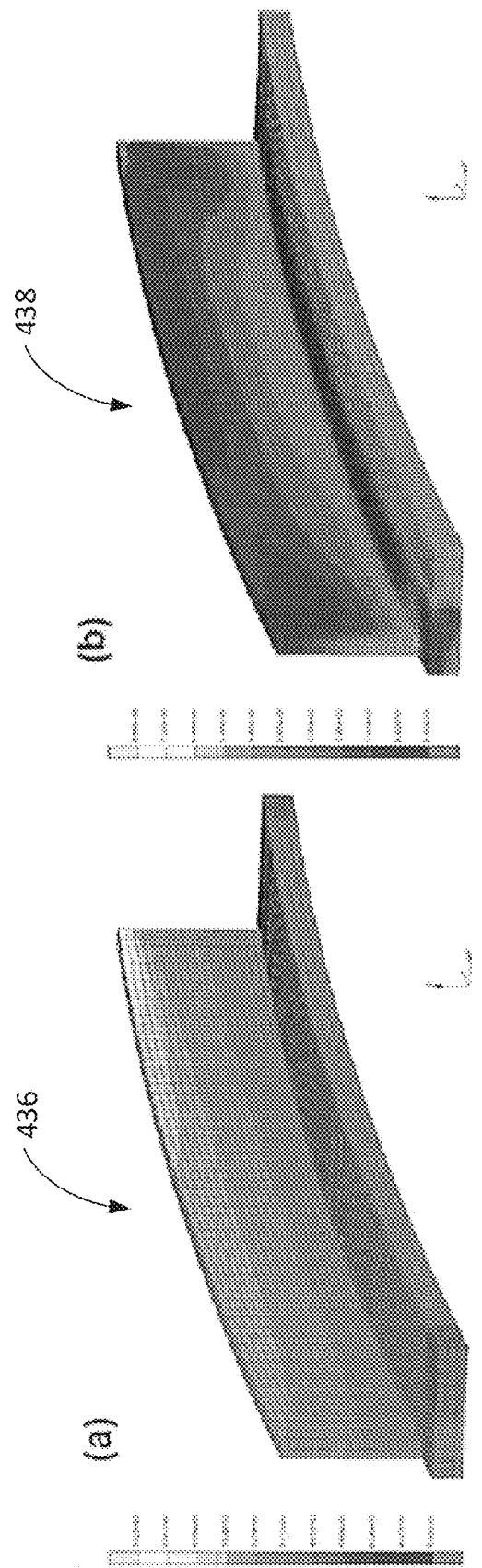
FIG. 22 shows "heat maps" of the temperature and von Mises stress distribution predicted at the end of build for a T-shaped part built on a pre-bent substrate.
Figure 23:
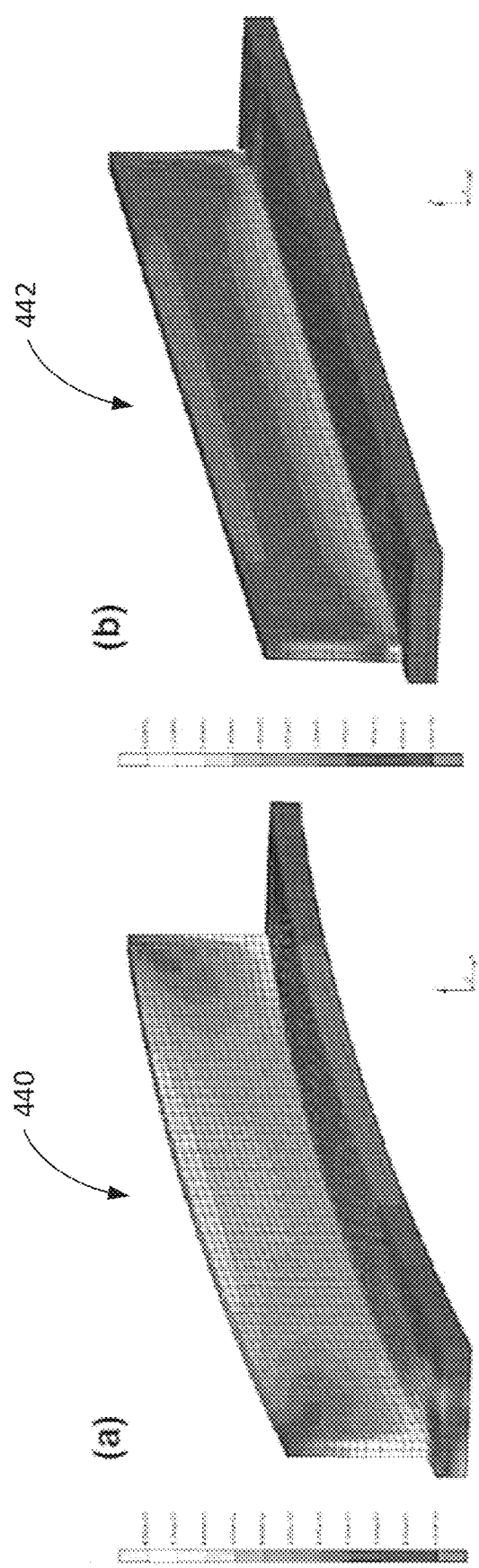
FIG. 23 shows "heat maps" of the predicted evolution of von Mises stress in the build with pre-bent substrate after cooling and after clamp release.

FIG. 22 shows "heat maps" 436 and 438 depicting the temperature and von Mises stress distribution predicted at the end of build for a T-shaped part built on a pre-bent substrate. FIG. 23 shows "heat maps" 440 and 442 depicting the predicted evolution of von Mises stress in the build with pre-bent substrate (a) after cooling to below 100° C. and (b) after clamp release.

The Applicants' modelling predicted that post-build distortion should straighten the pre-bent substrate but experiments showed that it was not the case. In these experiments, the substrate plate was pre-bent to a value of ~5 mm in the direction opposite to the expected distortion (i.e. with a maximum bow of 5 mm at the substrate mid plane along the longitudinal direction. This corresponds to 100% of post-build distortion (approximately 5 mm) observed in baseline one-sided T-shaped builds where the substrate was clamped with aluminium bars. Subsequent experimental verification showed that an average post-build distortion measured at −1.76 mm remained, indicating the pre-bent value of −5 mm was excessive. It should be noted that this model was based on the Johnson-Cook material model which tends to over-predict post-build distortion. The pre-bent value suggested based on the modelling results at the time therefore became excessive.

Figure 24:
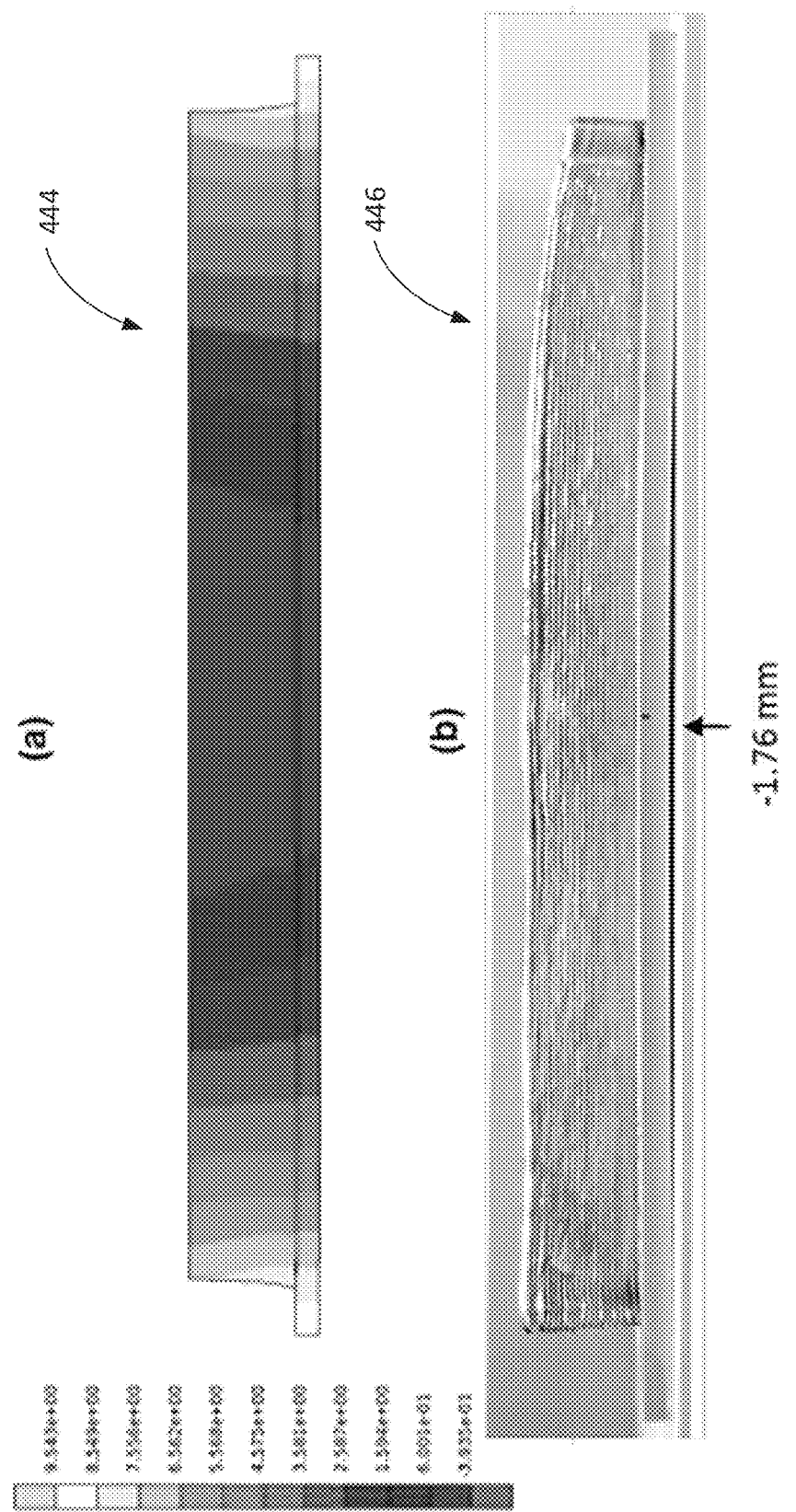
FIG. 24 shows the comparison between post-build distortion as predicted by the modelling shown in a "heat map" and the measured distortion of the corresponding experimental build as depicted in an image.

FIG. 24 shows the comparison between post-build distortion as predicted by the modelling and as shown in a "heat map" 444 and the measured distortion of the corresponding experimental build as shown in an image 446. As discussed earlier, while the model predicts that distortion should be close to zero, the pre-bent has not been completely compensated during the experimental build.

FIG. 25 depicts an example of a more complex geometry 450 than the geometries depicted in FIGS. 5 and 6.

FIG. 26 shows "heat maps" 452 and 454 respectively depicting isometric and side views of the post-build distortion of the geometry 450 predicted by modelling, FIG. 27 shows "heat maps" 456 and 458 respectively depicting isometric and side views of the distortion of the geometry 450 after cooling to below 100° C. in the chamber predicted by modelling, and FIG. 28 shows "heat maps" 460 and 462 respectively depicting isometric and side views of the distortion predicted by modelling of the geometry 450 after release of the workpiece from clamps. The "heat maps" 452 to 462 shown in FIGS. 26 to 28 are predicted examples where no alterations to compensate for predicted distortion are introduced to the workpiece prior to or during fabrication.

Figure 31:
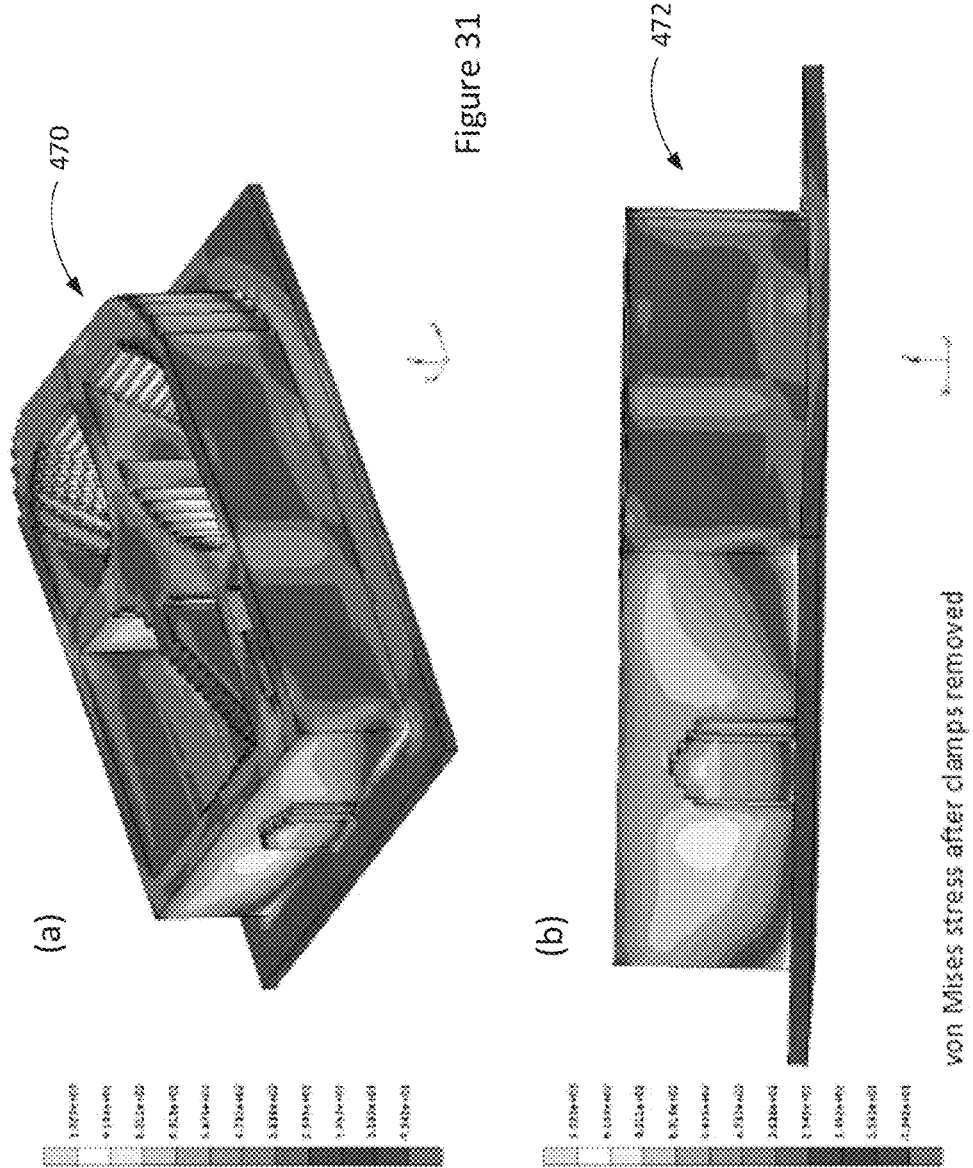

Corresponding "heat maps" showing predicted distortion when alterations are introduced to the workpiece to compensate for predicted distortion prior to or during fabrication are shown in FIGS. 29 to 31. FIG. 29 shows "heat maps" 464 and 466 respectively depicting isometric and side views of the post-build distortion of the geometry 450 predicted by modelling, FIG. 30 shows a "heat map" 468 of an isometric view of the distortion of the geometry 450 predicted by the modelling after cooling to 100° C., and FIG. 31 shows "heat maps" 470 and 472 depicting isometric and side views of the distortion of the geometry 450 predicted by the modelling after release of the workpiece from clamps.

In this example, the distortion compensating alterations were performed using the following steps:

a) Model/analyse the reference build shown in FIG. 25 using conventional tooling arrangement to predict the evolution of thermal distribution, distortion and stress during manufacture;

b) Model/analyse a 1st iteration of a distortion compensated build where, in this case, the whole substrate plate was artificially constrained against vertical displacement (i.e. kept flat) to predict the evolution of thermal distribution, distortion, stress and reaction forces at all clamping points;

c) Apply distortion compensating alterations to the substrate using the predicted distortion from step b) (one way to achieve that is to apply a reversed vertical deformation having ½ or ¾ magnitude of the predicted distortion in step b to the substrate) and then model/analyse a 2nd iteration of the distortion compensated build where, in this case, the whole substrate plate was artificially constrained against vertical displacement to predict the evolution of thermal distribution, distortion, stress and reaction forces at clamping points; and d) Repeat step c) until build tolerance is achieved.

It can be seen from FIGS. 29 to 31 that predicted distortion is significantly reduced at all stages of fabrication when alternations are introduced to the workpeice prior to or during fabrication to compensate for the predicted distortion seen in FIGS. 26 to 28.

Figure 32:
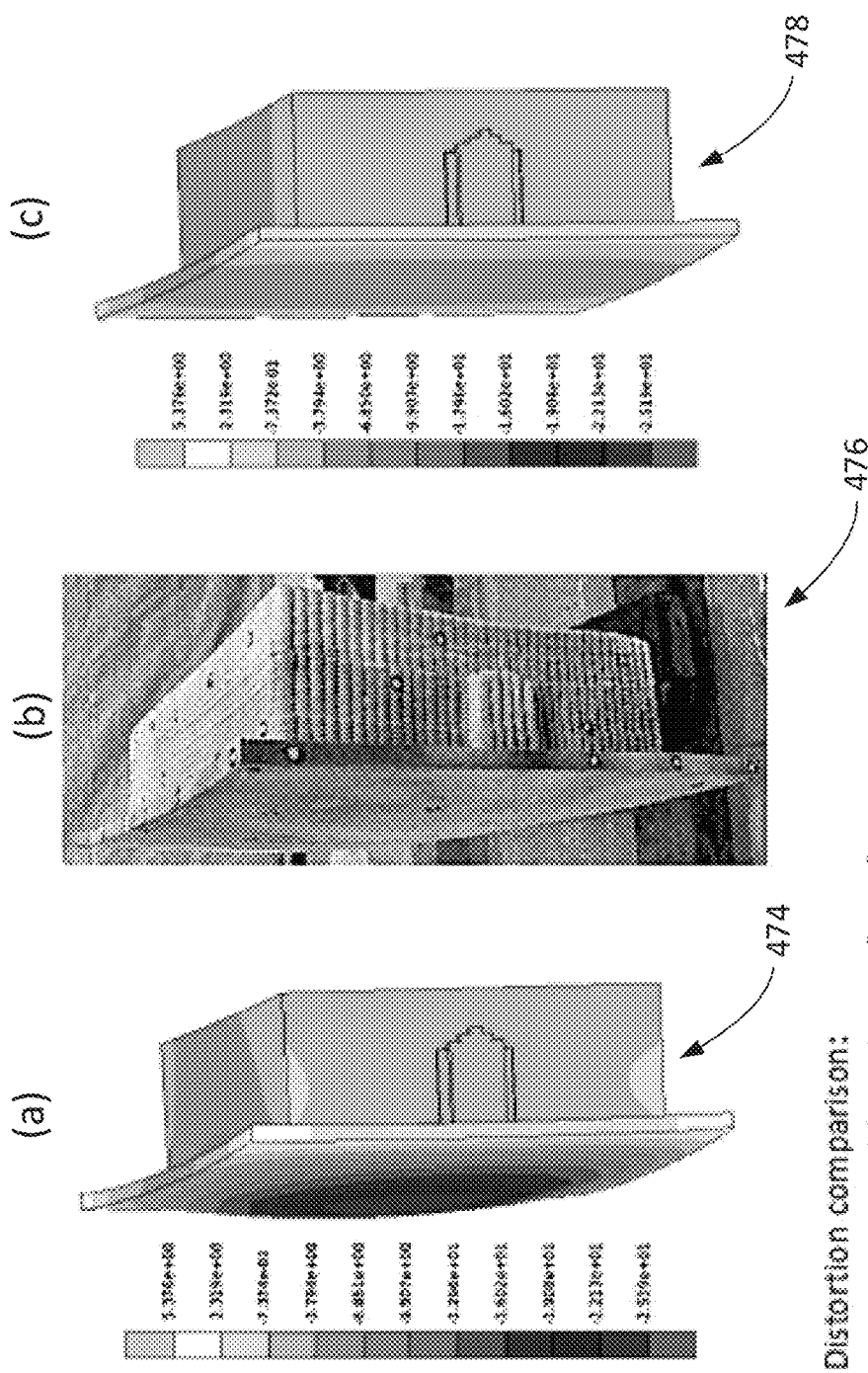
FIG. 32 shows a "heat map" 474 of predicted distortion in the workpiece geometry of FIG. 25 without the introduction of distortion compensating alternations, an image of a fabricated workpiece, and a "heat map" showing model predicted distortion when distortion compensating alternations are introduced into the model.

This reduction in distortion is confirmed in FIG. 32, which depicts a "heat map" 474 showing model predicted distortion without the introduction of distortion compensating alternations, an image 476 of a fabricated workpiece and a "heat map" 478 showing model predicted distortion when distortion compensating alternations are introduced into the model.

The invention claimed is:

1. A method of minimising distortion in a workpiece, including the steps of:
    in a computer system, carrying out finite element analysis on a finite element thermo-mechanical model of the workpiece during and after fabrication by additive manufacturing to predict shape distortion and residual stress development in the workpiece, wherein the fabrication includes the fabrication step of depositing multiple layers of a material melted by a heat source along a deposit path on a substrate;
    minimising heat loss from the substrate and the deposited material during the fabrication by preventing an average temperature of the workpiece from falling by more than 10% between deposition of successive layers of the material; and
    introducing alterations to the workpiece prior to or during fabrication to compensate for the predicted distortion.

2. A method according to claim 1, wherein the fabrication further includes one or more of the following fabrication steps: preheating of the substrate, cooling of the workpiece and subsequent release of mechanical constraints on the workpiece.

3. A method according to claim 2, wherein the heat source includes one or more of an electron beam, welding arc, plasma arc or laser beam.

4. A method according to claim 1, wherein the alterations are made to one or more of the substrate geometry and the deposit path.

5. A method according to claim 1, wherein the model includes a heat conduction element for modelling heat conduction in the substrate and the deposited material.

6. A method according to claim 1, wherein the model includes a heat transfer element for modelling heat transfer from the workpiece to the exterior.

7. A method according to claim 6, wherein the heat transfer element models heat transfer according to thermal radiation of the workpiece.

8. A method according to claim 7, wherein the heat transfer element models heat transfer according to $$q = \varepsilon \sigma (T^4 - T_{amb}^4)$$

where q is the heat flux, T is the temperature and $T_{amb}$ is the ambient temperature, $\varepsilon$ is the surface emissivity and $\sigma$ is the Stefan-Boltzmann constant.

9. A method according to claim 7, wherein the heat transfer element additionally models heat transfer according to thermal conduction of the workpiece.

10. A method according to claim 9, wherein the heat transfer element models heat transfer according to $$q = h(T - T_{amb})$$

where q is the heat flux, h is the heat transfer coefficient, T is the temperature and $T_{amb}$ is the ambient temperature.

11. A method according to claim 1, wherein the model includes an elastic deformation element using Hooke's law, Young's modulus, Poisson's ratio and the coefficient of thermal expansion of the material.

12. A method according to claim 1, wherein the model includes a yielding behaviour element following the von Mises criterion.

13. A method according to claim 1, wherein the model includes a yielding behaviour element following empirically deriving temperature dependant flow stress data.

14. A method according to claim 1, wherein the model includes a material deposition element where deposition of the material is modelled at the liquidus temperature or slightly above the liquidus temperature with a small amount of superheat.

15. A method according to claim 1, wherein the model includes a solidification element.

16. A method according to claim 1, wherein the model includes a material deposition element where deposition of the material by application of an energy/heat source to melt the material is modelled.

17. A method according to claim 1, and further including the step of:
    using stress analysis information from the finite element analysis to identify local stress raisers that require relief during one or more of the fabrication stages using the heat source.

18. A method according to claim 1, and further including the step of minimising heat loss from the substrate and the deposited material during one or more of the fabrication stages by applying insulation to the workpiece during and after fabrication.

19. A method according to claim 1, and further including the step of minimising heat loss from the substrate and the deposited material during one or more of the fabrication stages by applying radiation reflection to the workpiece.

20. A method according to claim 1, and further including the step of:
    minimising the thermal gradient between the workpiece and the substrate by preheating the substrate before deposition of the material.

21. A method according to claim 1, and further including the step of:
    controlling mechanical boundary conditions during one or more of the fabrication stages by controlled reduction of clamping forces in line with varying critical stress as the part cools so as to minimise or avoid crack formation or other fabrication defects.

22. A method according to claim 1, wherein the material is a metal or metal alloy.

23. A method according to claim 22, wherein the metal alloy comprises any one or more of titanium, aluminium, nickel, vanadium, tantalum, copper, scandium, boron or magnesium.

24. A method according to claim 23, wherein the metal alloy is titanium alloy Ti-6Al-4V.

25. An additive manufacturing apparatus for fabricating a workpiece, comprising:
    a heat source, a wire feeder, a work table for supporting a substrate on which material is deposited, a movement mechanism for providing relative movement of the heat source, wire feeder and work table, and an evacuated chamber enclosing the heat source, wire feeder, work table and movement mechanism;
    a control device for controlling operation of the heat source, wire feeder, work table and movement mechanism, wherein the control device is configured to minimize heat loss from the substrate and the deposited material during fabrication by preventing an average temperature of the workpiece from falling by more than 10% between deposition of successive layers of the material; and
a computer system including:
  a main memory for storing computer readable code for a finite element analysis application module; and
  at least one processor coupled to the main memory, said at least one processor executing the computer readable code in the main memory to cause the application module to carry out finite element analysis on a finite element thermo-mechanical model of the workpiece prior to and during fabrication to predict shape distortion and/or residual stress development in the workpiece.

* * * * *